United States Patent [19]

Iwasaki

[11] Patent Number: 5,280,188
[45] Date of Patent: * Jan. 18, 1994

[54] METHOD OF MANUFACTURING A SEMICONDUCTOR INTEGRATED CIRCUIT DEVICE HAVING AT LEAST ONE BIPOLAR TRANSISTOR AND A PLURALITY OF MOS TRANSISTORS

[75] Inventor: Hiroshi Iwasaki, Chigasaki, Japan

[73] Assignee: Kabushiki Kaisha Toshiba, Kawasaki, Japan

[*] Notice: The portion of the term of this patent subsequent to Sep. 1, 2007 has been disclaimed.

[21] Appl. No.: 989,455

[22] Filed: Dec. 8, 1992

Related U.S. Application Data

[60] Continuation of Ser. No. 619,651, Nov. 19, 1990, abandoned, which is a division of Ser. No. 315,910, Feb. 24, 1989, abandoned, which is a division of Ser. No. 240,484, Sep. 6, 1988, abandoned, which is a continuation of Ser. No. 837,385, Mar. 6, 1986, abandoned.

[30] Foreign Application Priority Data

| Mar. 7, 1985 | [JP] | Japan | 60-45137 |
| Mar. 8, 1985 | [JP] | Japan | 60-46023 |
| Mar. 15, 1985 | [JP] | Japan | 60-51720 |
| Mar. 29, 1985 | [JP] | Japan | 60-65230 |
| Mar. 29, 1985 | [JP] | Japan | 60-65231 |

[51] Int. Cl.⁵ .............. H01L 29/72; H01L 27/02; H01L 23/48; H01L 29/46
[52] U.S. Cl. ............... 257/370; 257/377; 257/587; 257/588; 257/591; 257/755; 257/757; 257/773; 257/776
[58] Field of Search ............... 357/34, 36, 43, 59, 357/67, 71; 257/370, 377, 587, 588, 591, 755, 757, 773, 776

[56] References Cited

U.S. PATENT DOCUMENTS

| 3,489,964 | 1/1970 | Masuda | 357/36 |
| 3,667,008 | 8/1972 | Katnack | 357/59 |
| 3,742,319 | 12/1973 | Byran et al. | 357/36 |
| 4,125,426 | 11/1978 | Inayoshi et al. | 156/656 |
| 4,362,597 | 12/1982 | Fraser et al. | 437/200 |
| 4,364,166 | 12/1982 | Crowder et al. | 357/67 |
| 4,373,251 | 2/1983 | Wilting | 437/34 |
| 4,400,865 | 8/1983 | Goth et al. | 357/36 |
| 4,433,470 | 2/1984 | Kameyama et al. | 357/67 |
| 4,497,106 | 2/1985 | Momma et al. | 357/43 |
| 4,965,220 | 10/1990 | Iwasaki | 357/43 |
| 5,045,916 | 9/1991 | Vor et al. | 257/757 |

FOREIGN PATENT DOCUMENTS 60-164356 8/1985 Japan ............... 357/34

Primary Examiner—J. Carroll
Attorney, Agent, or Firm—Finnegan, Henderson, Farabow, Garrett & Dunner

[57] ABSTRACT

A semiconductor device includes a bipolar transistor and an IIL element fabricated on a single wafer. The emitter region of the bipolar transistor is formed by diffusing the impurity of an impurity layer formed in contact with the base region therein. The impurity layer is formed of a polycide layer formed of a polysilicon layer doped with an impurity and a metal silicide layer laminated on the polysilicon layer, a laminated layer of a polysilicon layer and a refractory metal layer, or a metal silicide layer.

44 Claims, 24 Drawing Sheets

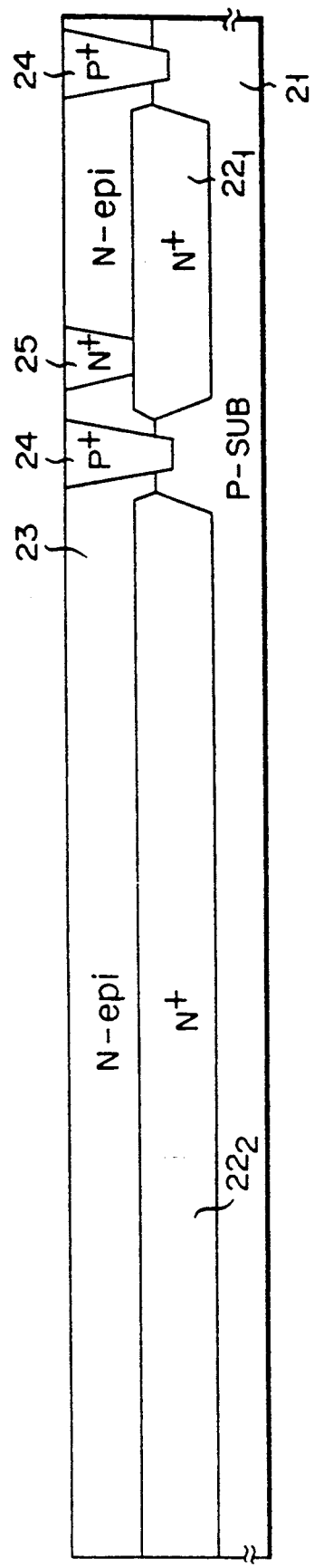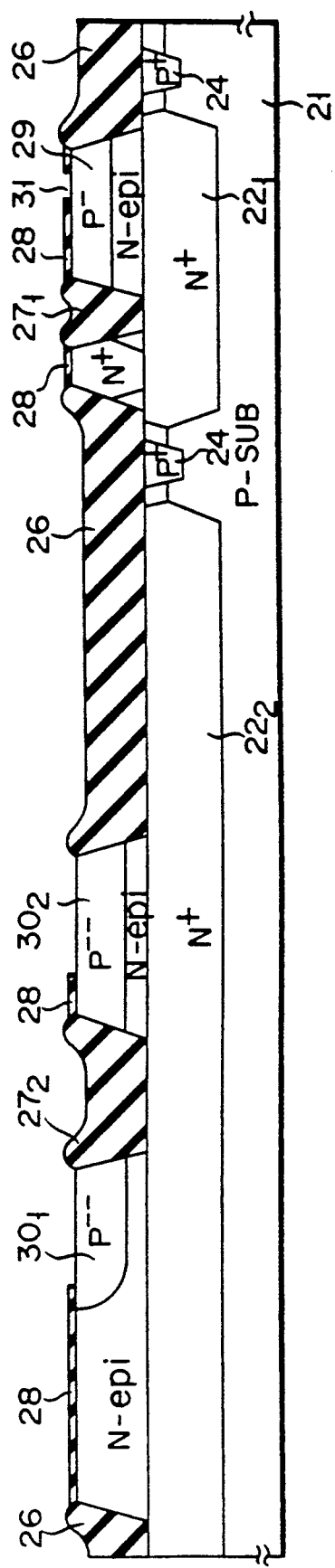
FIG. 1A
FIG. 1B

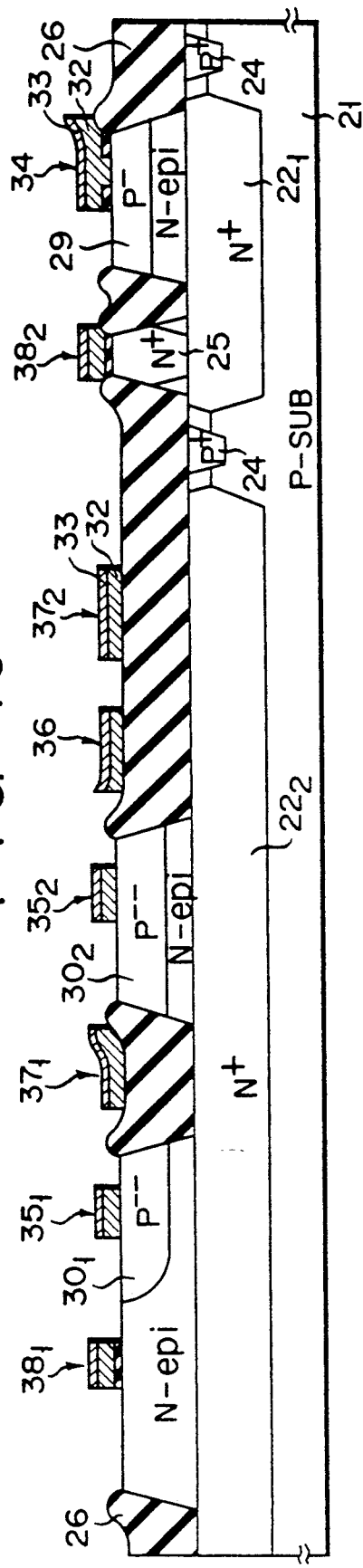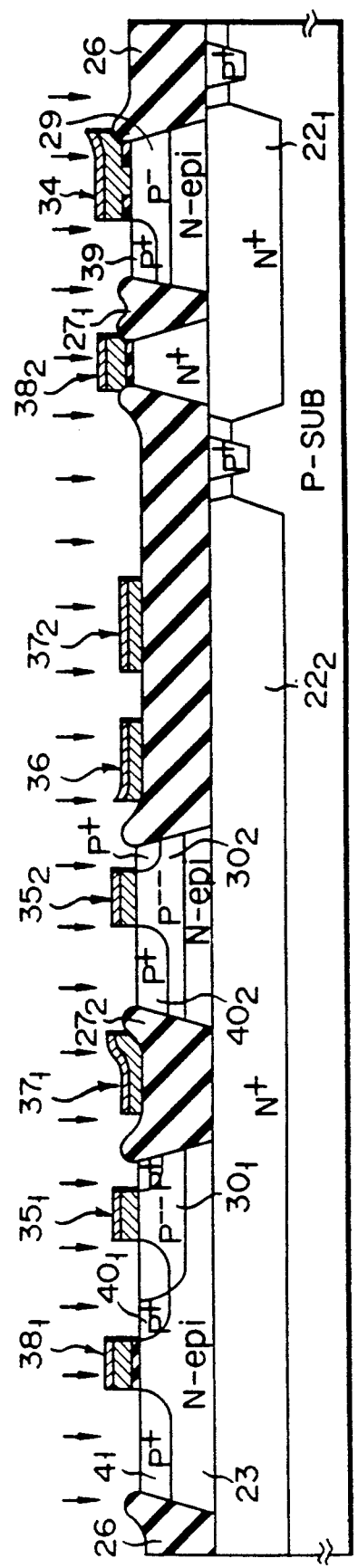

$S_E = 1$
$S_B = 6$ $S_E = 2$
$S_B = 9$ $S_E = 2$
$S'_B = 12$ $S_E = 3$
$S_B = 15$ $S_E = 3$
$S'_B = 18$

F I G. 4
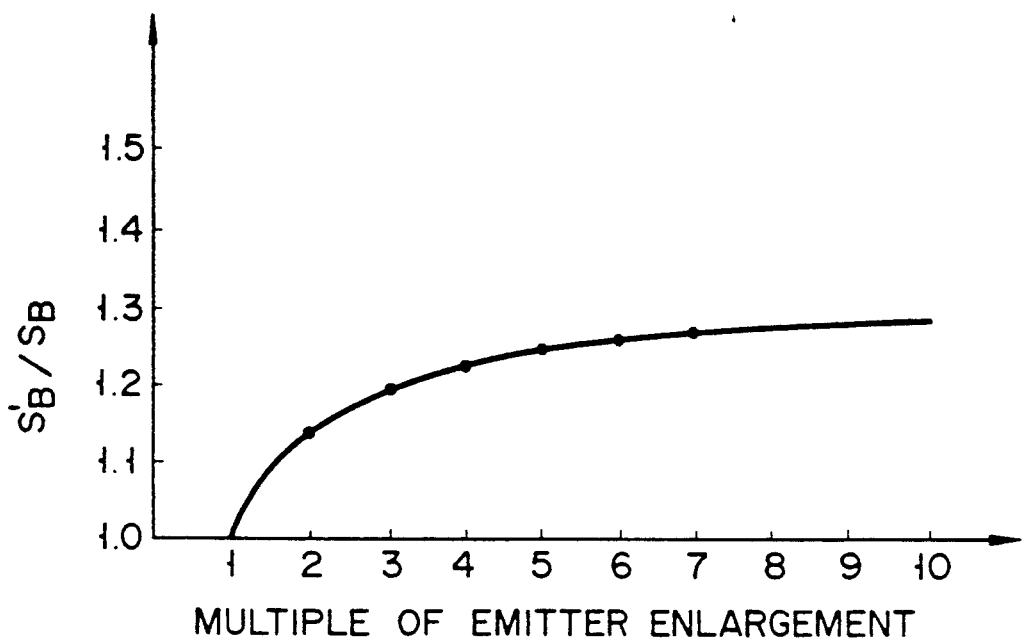
F I G. 5
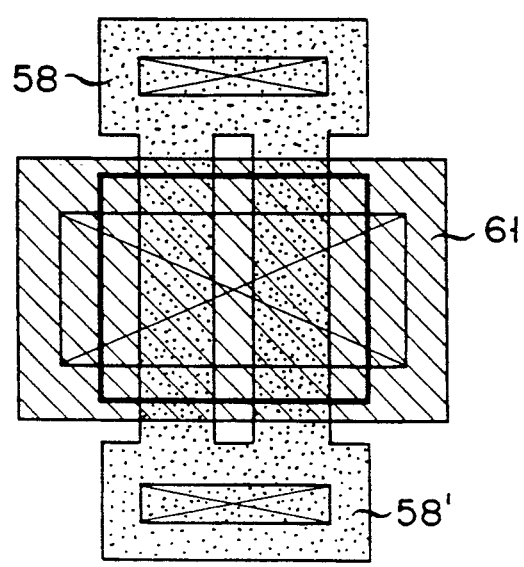

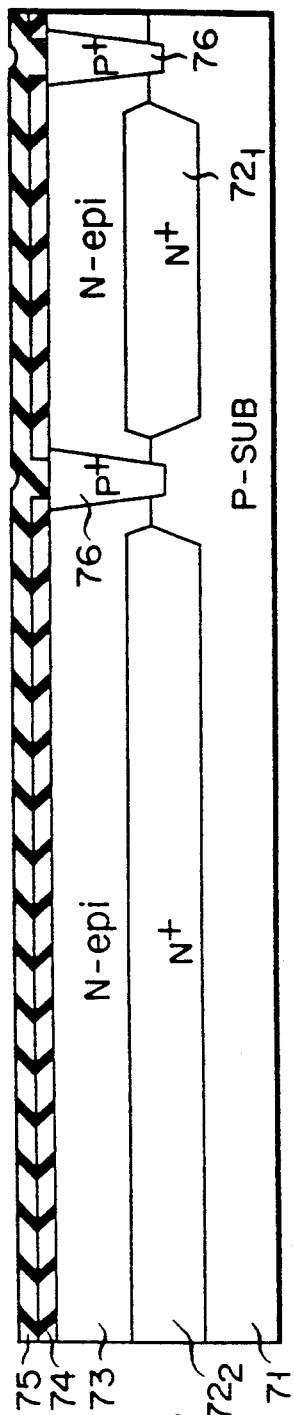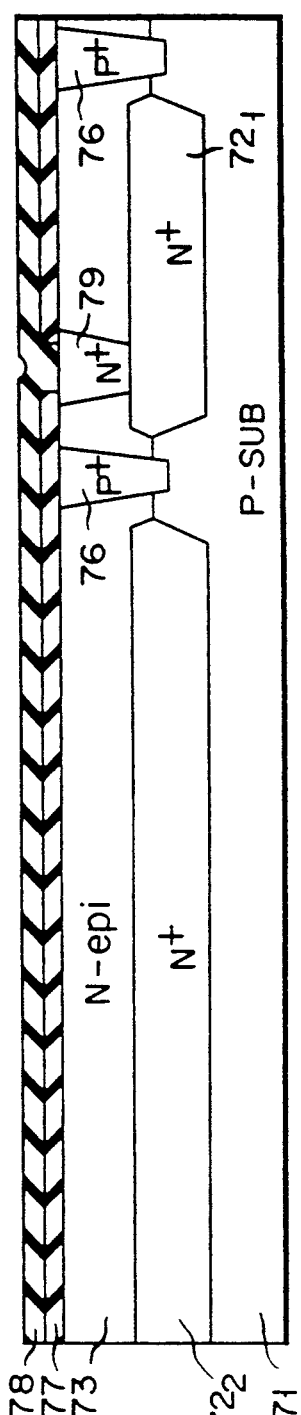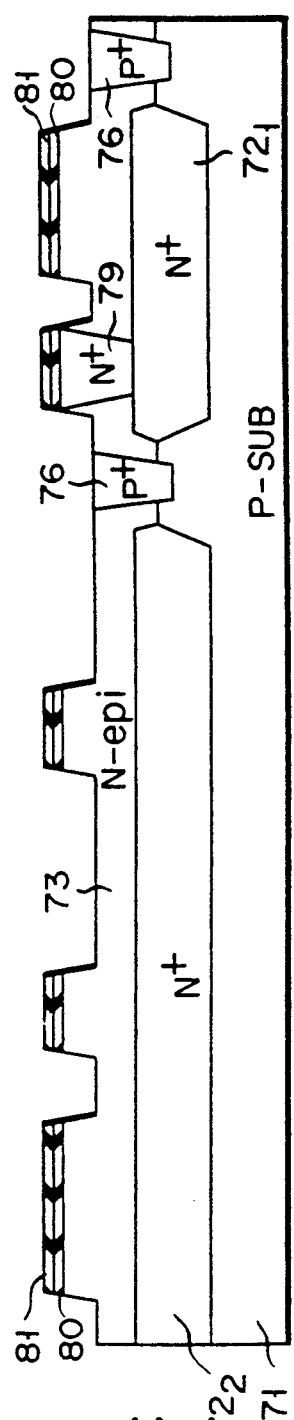

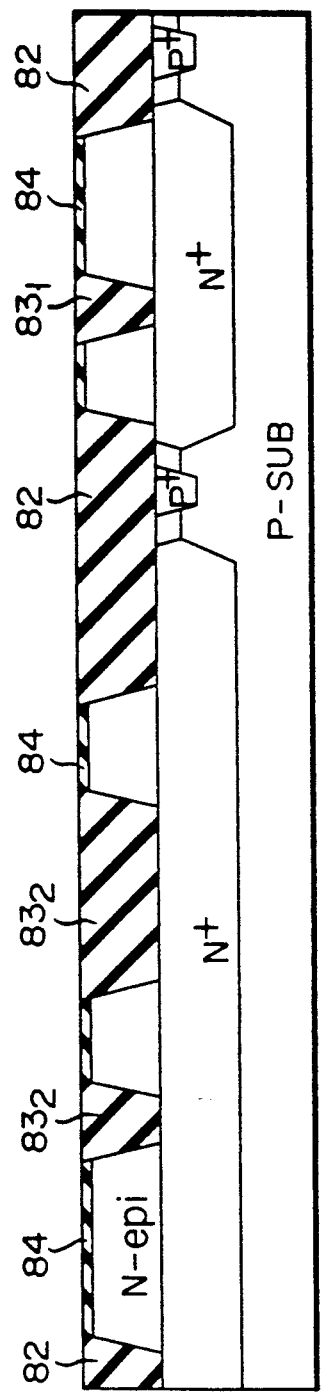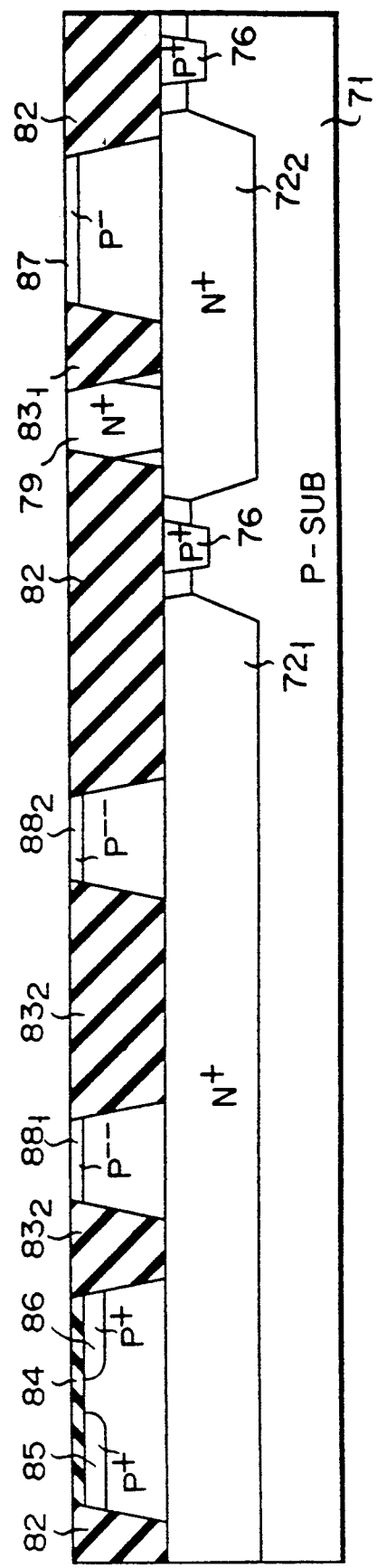

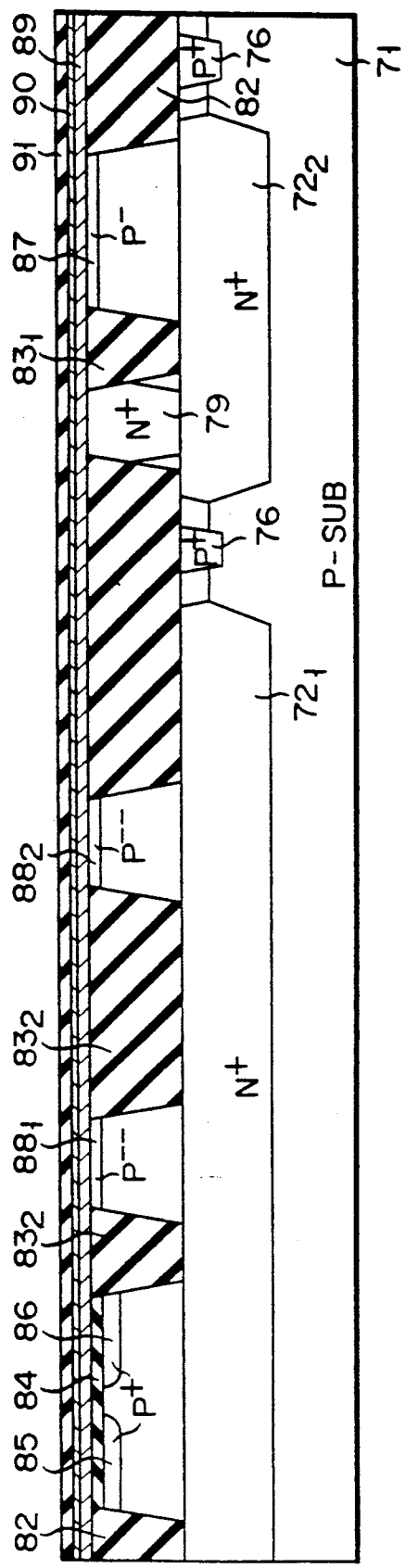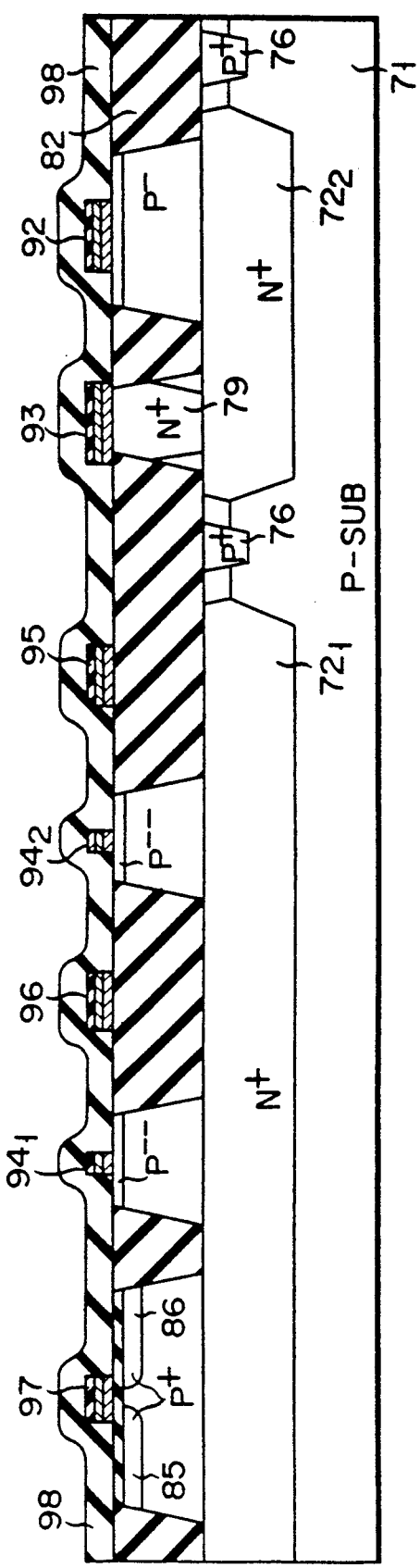

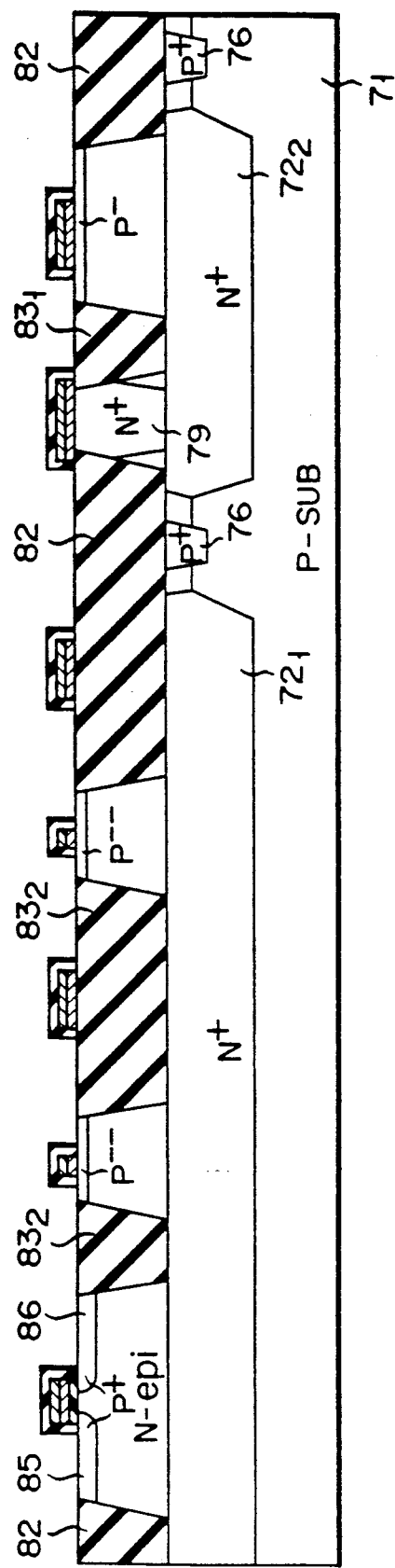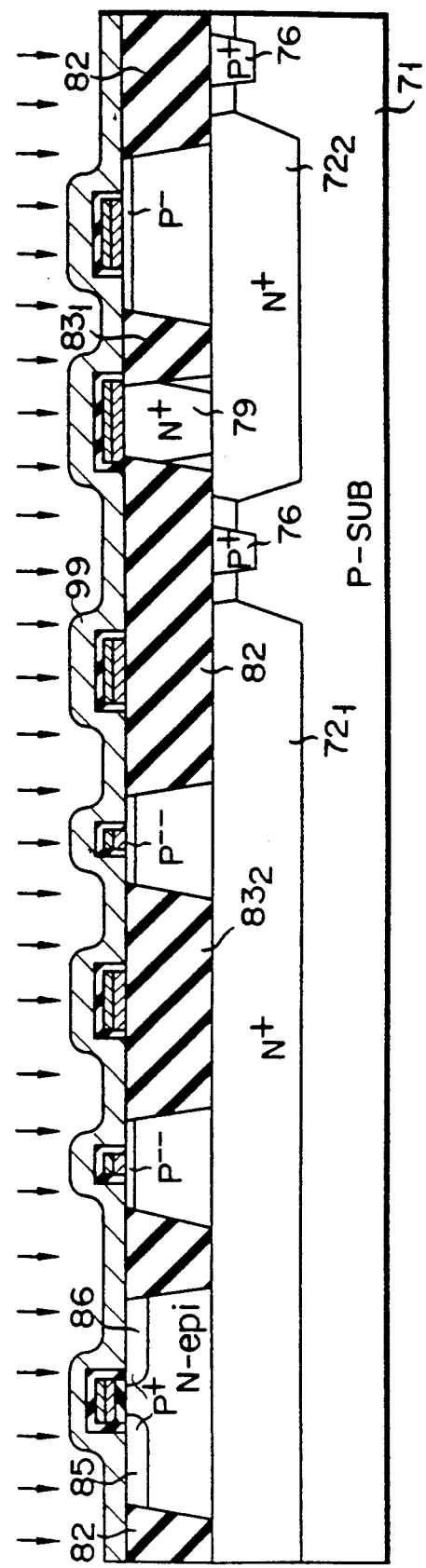

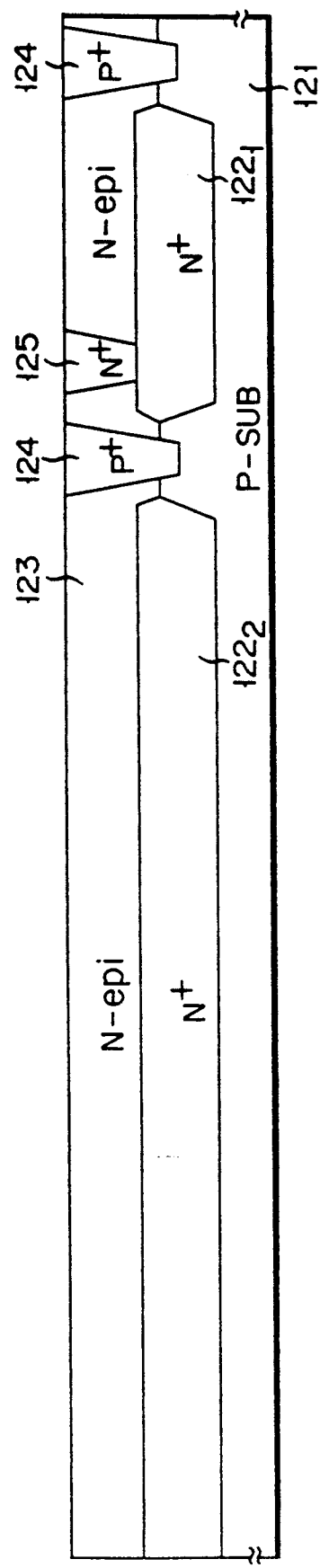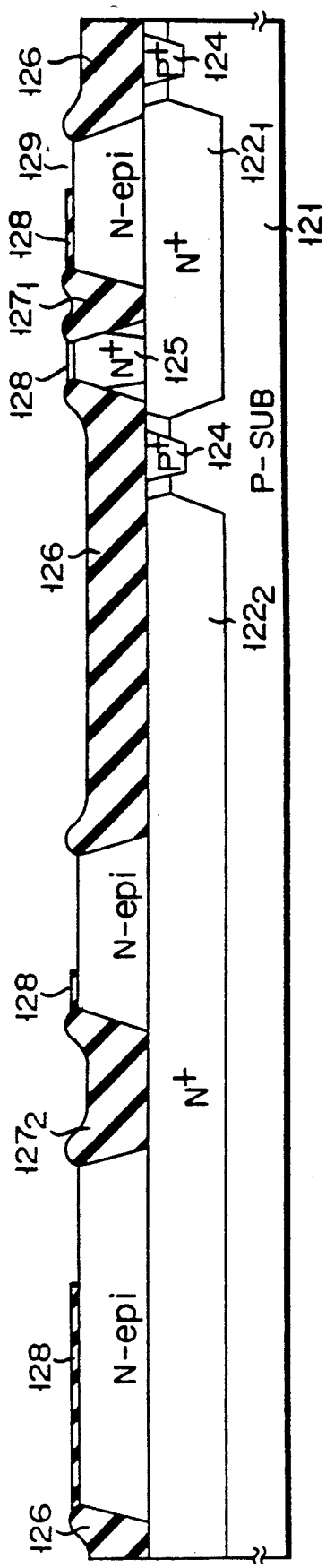
FIG. 12A
FIG. 12B

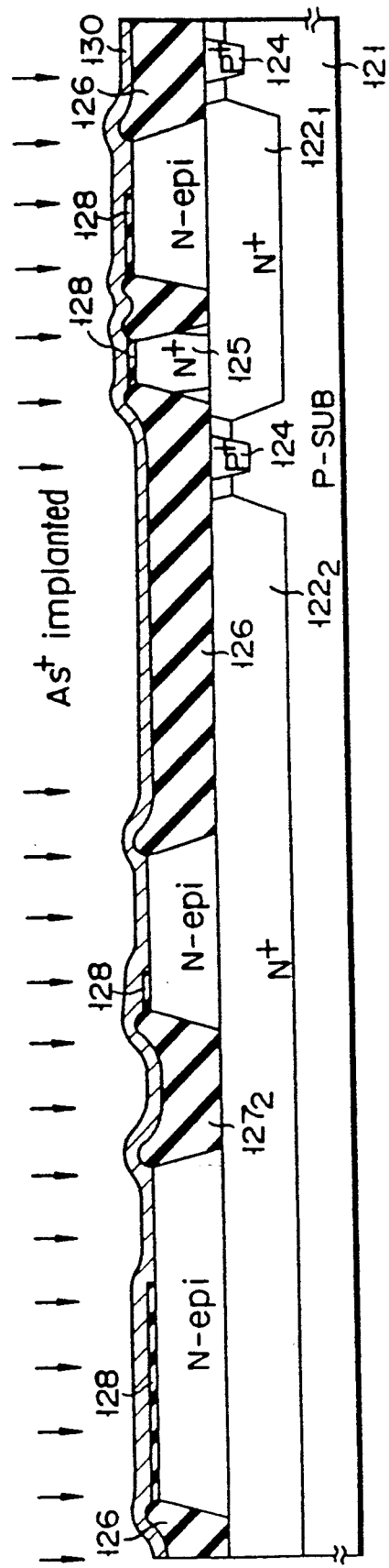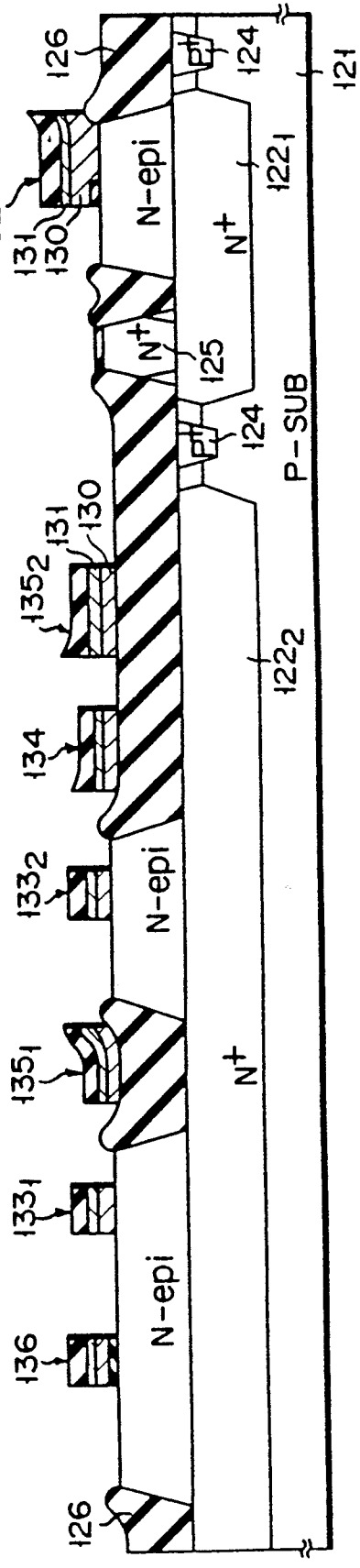

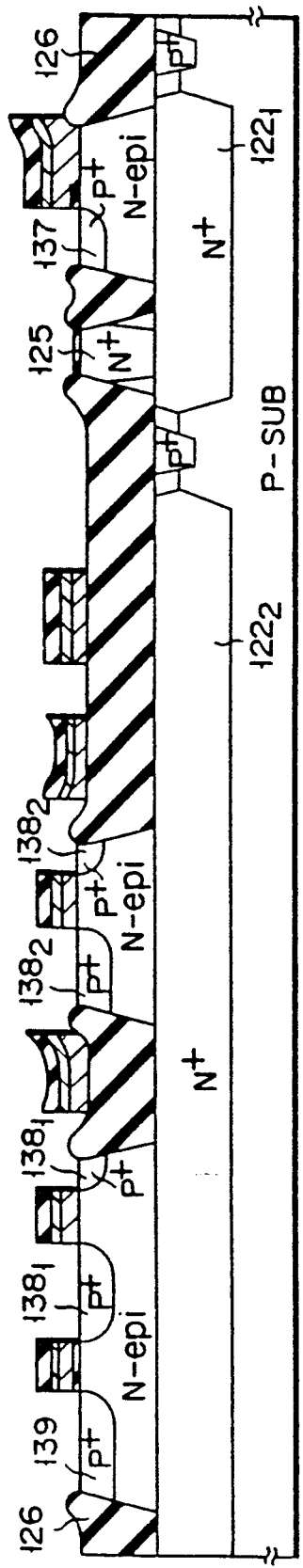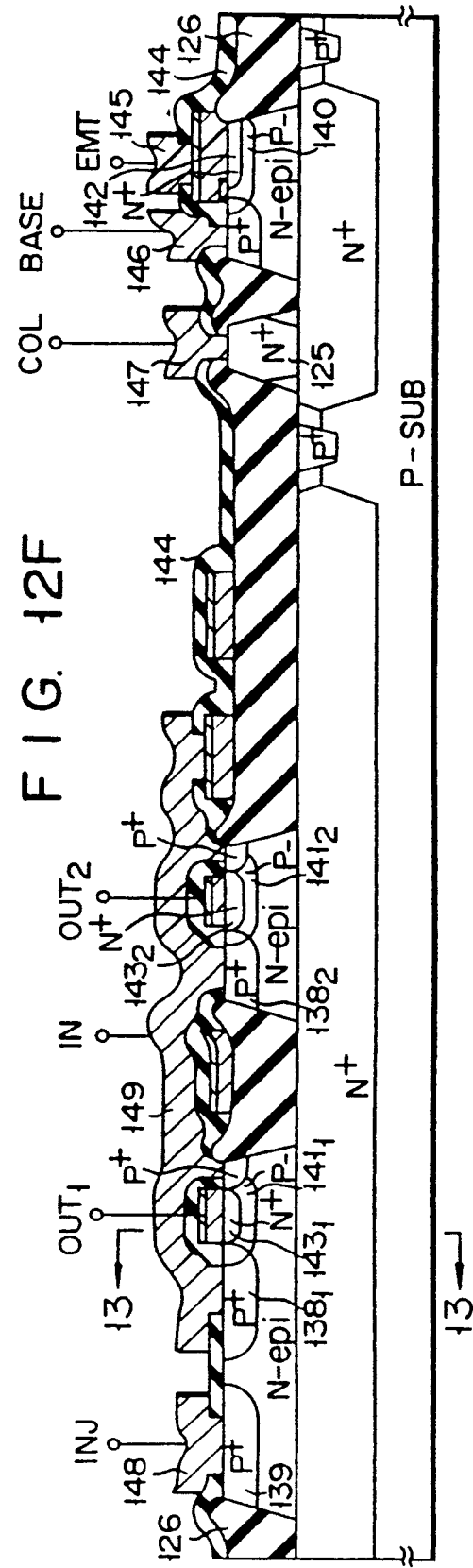

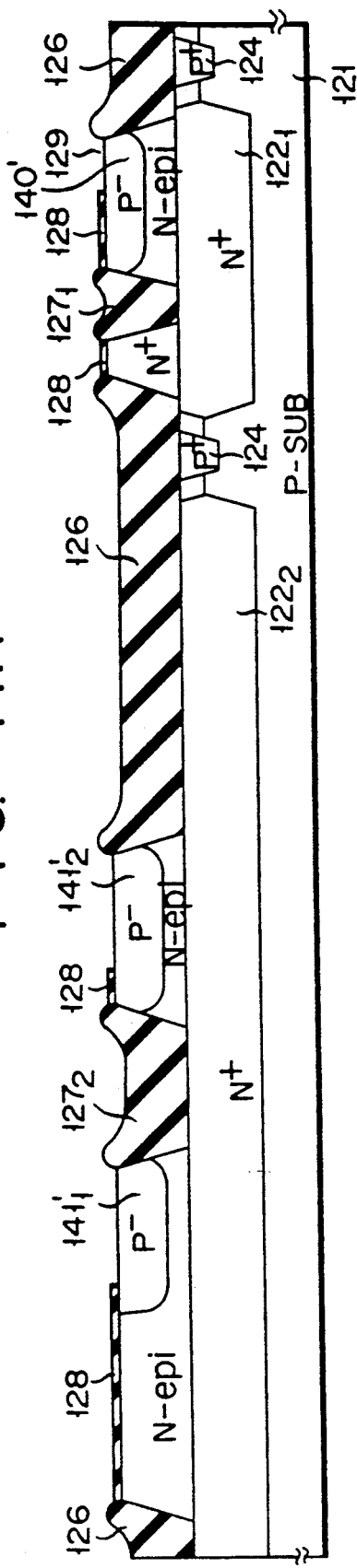
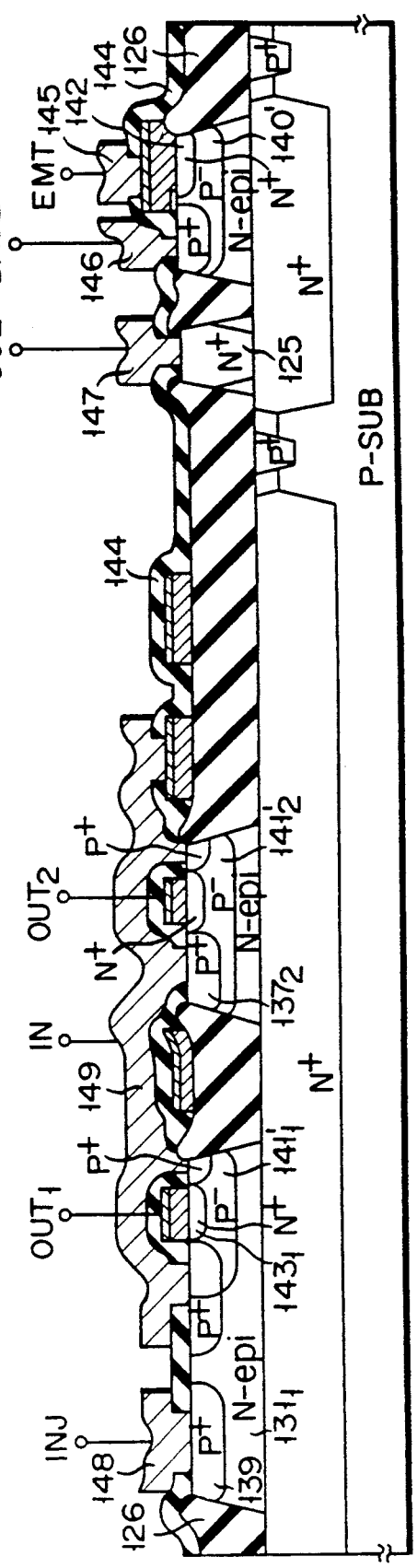
FIG. 14A
FIG. 14B

METHOD OF MANUFACTURING A SEMICONDUCTOR INTEGRATED CIRCUIT DEVICE HAVING AT LEAST ONE BIPOLAR TRANSISTOR AND A PLURALITY OF MOS TRANSISTORS

This application is a continuation of application Ser. No. 07/619,651 filed Nov. 19, 1990, now abandoned, which is a division of application Ser. No. 07/315,910, filed Feb. 24, 1989, abandoned, which is a division of application Ser. No. 07/240,484, filed Sep. 6, 1988, abandoned, which is a continuation of application Ser. No. 06/837,385, filed Mar. 6, 1986, abandoned.

BACKGROUND OF THE INVENTION

The present invention relates to a semiconductor device including a bipolar transistor, in particular, a bipolar transistor with high speed characteristics, and to a method of manufacturing such a semiconductor device.

In order to improve the high speed characteristics of a bipolar transistor, it is necessary to form shallow emitter and base diffusion regions. In view of this, a conventional semiconductor device has an emitter electrode comprising a polysilicon layer and an emitter formed in a semiconductor region using the emitter electrode as a diffusion source. A device formed in this manner has the following structure. An n+-type buried region is formed in a p-type silicon substrate, and a vertical npn transistor is fabricated on the buried region. The npn transistor consists of an n−-type epitaxial layer surrounded by a field oxide layer and formed in the buried region, a p−-type active base region formed on the epitaxial layer, an external base region and an n+-type emitter region formed in the active base region, and an n+-type collector contact region formed in the buried region to be isolated from the emitter and base regions by an isolation region. The n+-type emitter region is connected to an aluminum electrode through a polysilicon layer. An aluminum base electrode is connected to the external base region and the n+-type collector contact region. Electrodes consisting of aluminum layers are connected to the collector contact region.

In the vertical transistor of the semiconductor device described above, arsenic is doped in a polysilicon layer forming an emitter electrode, and a shallow n+-type emitter region is formed in the active base region using the polysilicon layer as a diffusion source.

In an I²L device, a boron-doped polysilicon layer is used as a diffusion source for forming a collector region for the vertical transistor. The polysilicon layer is also used to connect logic gate elements.

A conventional semiconductor device of the type described above, wherein an impurity-doped polysilicon layer is used as an electrode and an impurity region is formed as a diffusion source in a semiconductor region, has the following problems:

For example, when the impurity concentration of the polysilicon forming the emitter electrode of a vertical transistor exceeds a predetermined value, the impurity diffuses anomalously in the base region and it becomes difficult to form a shallow emitter region. Therefore, the impurity concentration of the emitter electrode must be limited to a predetermined range. However, when the impurity concentration is limited in order to obtain a proper emitter diffusion depth, the sheet resistance of the polysilicon layer can become more than 100 Ω/square and high speed operation characteristics may be impaired.

In the case of an I²L device, the impurity concentration cannot be increased beyond a predetermined value for the same reason as described above. The resistance of the polysilicon layer and the wiring resistance are increased, thus interfering with high-speed operation. In addition, since a voltage drop occurs between an output electrode of one logic gate element and an input electrode of another logic gate element, a desired output level cannot be obtained and the inverter operation cannot be performed.

SUMMARY OF THE INVENTION

It is an object of the present invention to provide a semiconductor device wherein the electrode resistance is limited to a sufficiently small value and high speed operation characteristics can be improved, and a method of manufacturing such a semiconductor device.

According to the present invention, an impurity layer, serving both as a diffusion source for forming an emitter region of a bipolar transistor and also as a diffusion source for forming a collector region of a vertical transistor in an I²L device and wiring patterns, is formed of a laminated layer of a polysilicon layer and a metal silicide layer, so called, polycide layer, a laminated layer of a polysilicon layer and a refractory metal layer, or a metal silicide layer.

BRIEF DESCRIPTION OF THE DRAWINGS

FIGS. 1A to 1E are sectional views of resultant semiconductor structures obtained in the manufacturing processes of a semiconductor device according to an embodiment of the present invention;

FIG. 4 is a graph for demonstrating the effectiveness of an emitter structure according to the present invention;

FIG. 5 is a plan view of an emitter structure according to the present invention;

FIGS. 7A to 7K are sectional views of semiconductor structures obtained in the manufacturing processes of a semiconductor device according to still another embodiment of the present invention;

FIGS. 12A to 12F are sectional views of semiconductor structures obtained in the manufacturing processes of a semiconductor device according to another method;

FIGS. 14A and 14B are sectional views showing semiconductor structures obtained by another manufacturing method;

DETAILED DESCRIPTION OF THE PREFERRED EMBODIMENTS

Figure 1E:
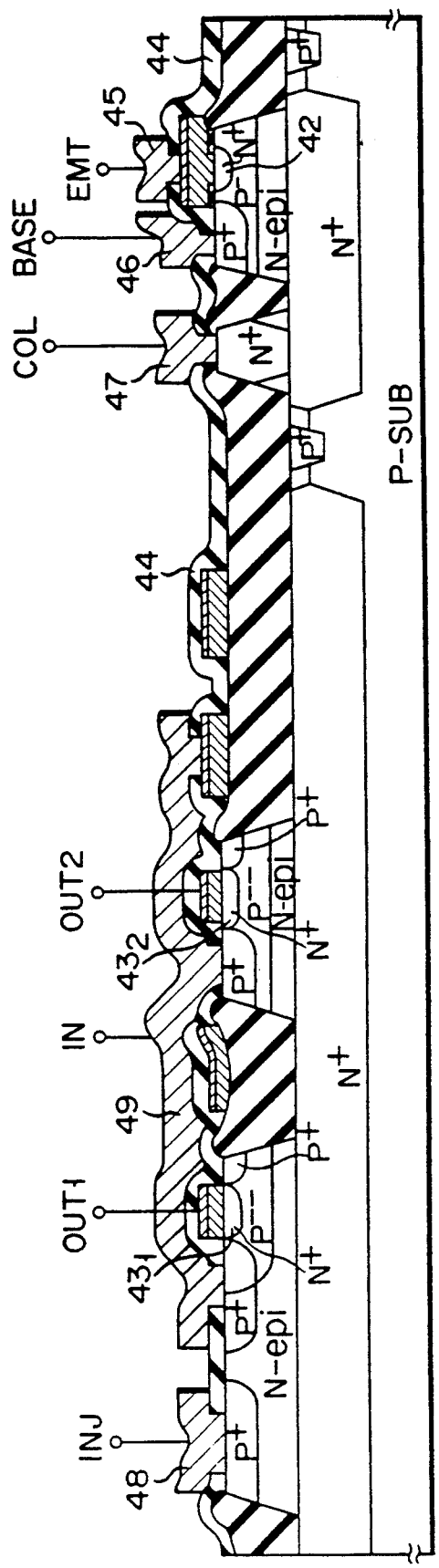

A semiconductor device including a vertical NPN transistor and an I$^2$L element will be described with reference to FIGS. 1A to 1E.

As shown in FIG. 1A, an N-type impurity such as antimony (Sb) is diffused into the surface of P-type silicon substrate 21 to form N$^+$-type buried region $22_1$ for a vertical NPN transistor and N$^+$-type buried region $22_2$ for an I$^2$L element. N-type epitaxial layer 23 is then formed on the entire surface of the resultant semiconductor structure. A P-type impurity such as boron is selectively diffused in layer 23 to form P$^+$-type isolation layer 24 in layer 23 for isolating the NPN transistor and I$^2$L element. An N-type impurity such as phosphorus is selectively diffused in layer 23 to form N$^+$-type diffusion region (a collector ohmic region for the NPN transistor) 25 extending to region $22_1$ and an N$^+$-type diffusion region or an emitter ohmic region (not shown) extending to region $22_2$.

In the process shown in FIG. 1B, buried field oxide layer 26 is formed in layer 23 to extend as far as regions $22_1$ and $22_2$ by a selective oxidation. Layer 26 isolates the bipolar transistor from the I$^2$L element. Oxide layer $27_1$ for fabricating the NPN transistor as a sidewall base contact structure and oxide layer $27_2$ for isolating the injector transistor and the inverter transistor of the I$^2$L element are formed on regions $22_1$ and $22_2$. Layers 26, $27_1$ and $27_2$ can be formed simultaneously (as in this embodiment) or separately. Oxide layer 28 having a thickness of 500 to 1,000 Å is formed in a region for forming the bipolar transistor and the I$^2$L element. Boron is selectively ion-implanted in the epitaxial layer using layer 28 as a buffer layer to form P$^-$-type active base region 29 for the NPN transistor and active base regions $30_1$ and $30_2$ for the I$^2$L element. Selective etching is then performed to form opening windows for forming an emitter diffusion region in oxide layer 28 covering the surface of active base region 29 of the NPN transistor, and to remove oxide layer 28 covering the collector region of the I$^2$L element.

In the process shown in FIG. 1C, undoped polysilicon layer 32 having a thickness of 500 to 2,000 Å is deposited by the CVD method on the entire surface of the resultant semiconductor structure shown in FIG. 1B. Arsenic is then doped in layer 32 at a dose of 2 to $20 \times 10^{15}$ cm$^{-2}$ by the ion-implantation method. A refractory metal silicide is deposited on layer 32 to a thickness of 1,000 to 3,000 Å and annealed. Resultant polysilicide layer 33 is patterned by selective etching to form emitter electrode 34 for the NPN transistor and collector electrodes $35_1$ and $35_2$ and input wiring 36 for the I$^2$L element. At the same time, mask patterns $38_1$ and $38_2$ for forming the next external base region and injector region are formed.

In the process shown in FIG. 1D, boron is ion-implanted in epitaxial layer 23 and regions 29, $30_1$ and $30_2$ using polycide patterns 34, $35_1$, $35_2$, 36, $37_1$, $37_2$, $38_1$ and $38_2$ and buried oxide layers 26, $27_1$ and $27_2$ as masks. Then, P$^+$-type external base region 39 for the NPN transistor, and P$^+$-type external base regions $40_1$ and $40_2$ and P$^+$-type injector region 41 for the I$^2$L element are formed.

The surface of polysilicide layer 33 is preferably protected by an insulation film or a resist film which prevents the ion-implantation of boron so that boron ions do not directly impinge upon polycide patterns 34, $35_1$, $35_2$, 36, $37_1$, $37_2$, $38_1$, and $38_2$.

In the process shown in FIG. 1E, arsenic is doped in regions 29, $30_1$ and $30_2$ using polycide emitter electrode 34 and polycide collector electrodes $35_1$ and $35_2$ as a diffusion source. Then, N$^+$-type emitter region 42 for the NPN transistor and N$^+$-type collector regions $43_1$ and $43_2$ for the I$^2$L element are fabricated. SiO$_2$ insulation film 44 is formed on the surface of the resultant structure by the CVD method, and a contact hole is formed therein. An aluminum film is deposited on the entire semiconductor substrate including film 44. The aluminum film is patterned to form electrodes 45 to 49. Electrodes 45, 46 and 47 respectively constitute emitter, base and collector terminals of the NPN transistor. Electrode 48 is an injector terminal of the I$^2$L element and electrode 49 is an input wiring line.

In the above embodiment, in the bipolar type semiconductor device shown in FIG. 1E, since the concentration of the impurity doped in the polycide film is controlled to be an optimal value, diffusion for forming the emitter region of the NPN transistor and the collector region of the I$^2$L element can be performed normally, and a shallow junction can be obtained. Thus, a bipolar transistor having excellent high speed operation characteristics is obtained. Moreover, since refractory metal silicide layer 33 constituting a polycide film has a low resistance, the electrode wiring formed by this polycide film has a low resistance. Therefore, the emitter of the NPN transistor has a very small resistance of several ohms. The high speed operation characteristics of the inverter transistor in the I$^2$L element are improved over conventional devices, and a voltage drop across the wiring when a polycide output wiring is used between logic gates is limited. The operation range of the logic gate is thus wider than that of conventional devices.

The metal silicide is preferably a silicide of a refractory metal, such as tungsten silicide (WSi), molybdenum silicide (MoSi), or titanium silicide (TiSi).

Figure 2A:
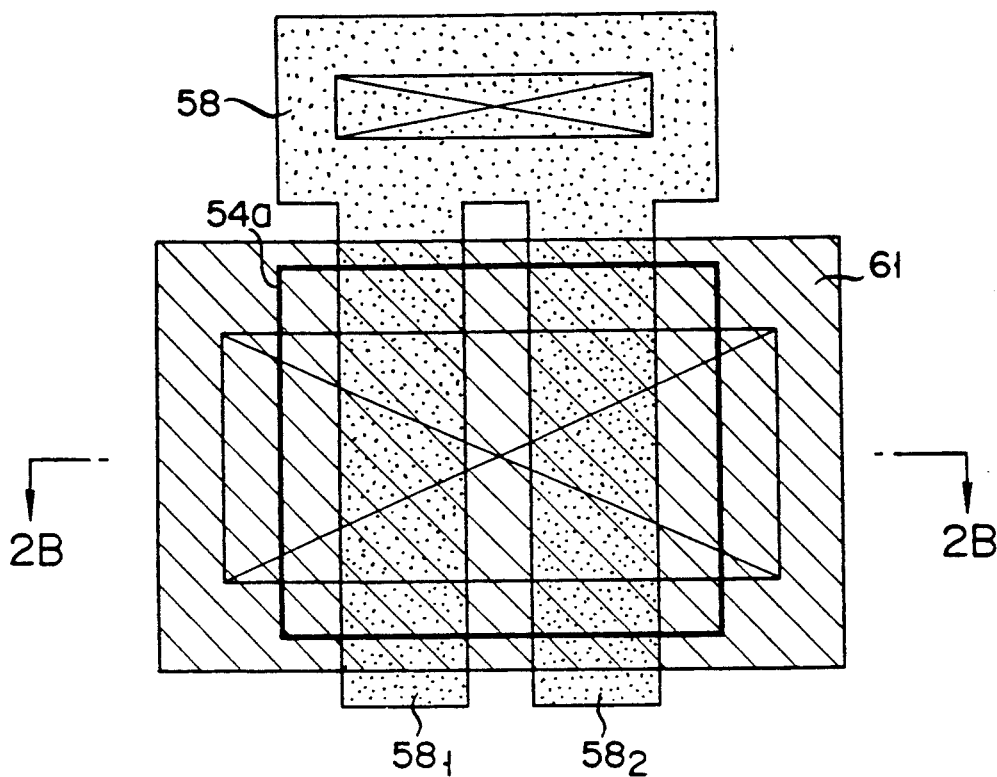
FIGS. 2A and 2B are a plan view and a sectional view, respectively, of an emitter of a bipolar transistor.
Figure 2B:
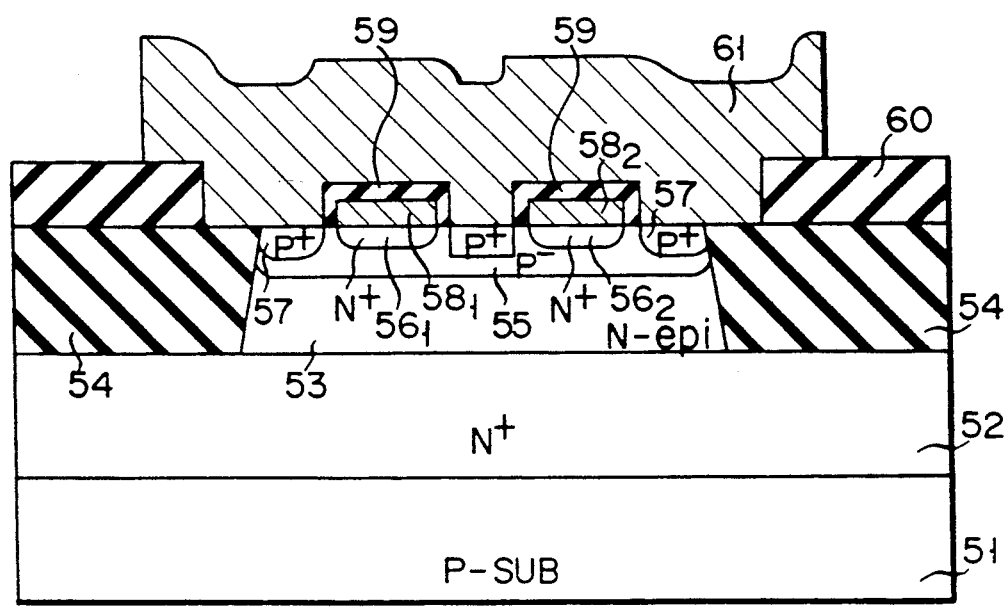

FIGS. 2A and 2B show a semiconductor device having an improved emitter structure using a polycide. N$^+$-type buried region 52 is formed in P-type silicon substrate 51. N-type epitaxial layer 53 is formed on region 52. Buried oxide layer (field oxide layer) 54 is formed in layer 53. Layer 53, defined by layer 54, constitutes a collector region of the vertical transistor. Active base region 55 of a sidewall base contact structure is formed in the surface of collector region 53 to be in contact with field oxide layer 54. Two separated N$^+$-type emitter regions $56_1$ and $56_2$ are formed in base region 55. Regions $56_1$ and $56_2$ are surrounded by P$^+$-type external base region 57. Emitter electrodes $58_1$ and $58_2$ are formed above emitter regions $56_1$ and $56_2$ by patterning a laminated layer of a polysilicon layer and a metal silicide layer, so called, polycide layer, a laminated layer of a polysilicon layer and refractory metal layer, or a metal silicide layer and are in ohmic contact with emitter regions $56_1$ and $56_2$. An N-type impurity such as arsenic is doped in the layer forming electrodes $58_1$ and $58_2$, and regions $56_1$ and $56_2$ are formed in active base region 55 using electrodes $58_1$ and $58_2$ as a diffusion source. Emitter electrodes $58_1$ and $58_2$ are covered with insulation layer 59 such as an $SiO_2$ layer formed by the CVD method. An $SiO_2$ or $Si_3N_4$ layer formed by the CVD method is formed as interlayer insulator 60 on field oxide layer 54. An opening for connection with a transistor region, i.e., N-type epitaxial region 53 and a part of layer 54 surrounding this region, is formed in interlayer insulator 60. An aluminum based layer is deposited on insulator 60 including the opening. The aluminum based layer is patterned to form base electrode 61 over insulator 60. Base electrode 61 crosses emitter electrodes $58_1$ and $58_2$ through insulating layer 59 and is in ohmic contact with external base region 57 at both sides of electrodes $58_1$ and $58_2$.

In the vertical NPN transistor shown in the plan view in FIG. 2A, edge 54a of field oxide layer 54 is illustrated by a thick solid line. The transistor region surrounded by layer 54 has a rectangular shape. Base electrode 61 formed by over locos (localized oxidation) covers the entire surface of the transistor region and extends to the outside. The edges of emitter electrodes $58_1$ and $58_2$ formed of a laminated layer of a polysilicon layer and a metal silicide layer, so called, polycide layer, a laminated layer of a polysilicon layer and a refractory metal layer, or a metal silicide layer extend from below base electrode 61 to above field oxide layer 54, and corresponding ends of the same electrodes are coupled by layer 58 formed of a laminated layer of a polysilicon layer and a metal silicide layer, so called, polycide layer, a laminated layer of a polysilicon layer and a refractory metal layer, or a metal silicide layer. In this embodiment, layer 58 formed on layer 60 outside electrode 61 serves as a basis. Two emitter electrodes $58_1$ and $58_2$ are formed by a single pattern extending from this basis, and the overall pattern constitutes an emitter of one NPN transistor. The emitter electrode is wired with an aluminum based material. Connection of the emitter electrode to other circuit elements is performed at basis 58 on field oxide layer 54.

Although not shown in FIGS. 2A and 2B, an N+-type collector contact region extending to N+-type buried region 52 and a collector electrode in ohmic contact with the contact region are formed.

Figure 3A:
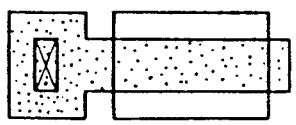
FIGS. 3A to 3E are plan views contrasting an emitter structure of a semiconductor device of the present invention with that of a conventional semiconductor device.
Figure 3B:
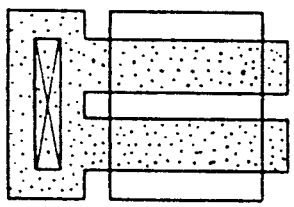
Figure 3D:
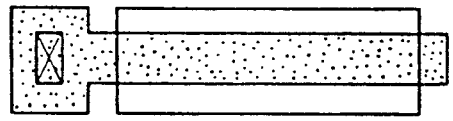

As in the above embodiment, two emitter regions $56_1$ and $56_2$ are formed inside single base region 55. With this structure, the emitter region is enlarged and a transistor having a high current capacity is obtained. In order to double the size of the emitter region in a conventional device, the length of the region must be doubled. However, in this embodiment, two emitter regions are aligned parallel to each other. The effect obtained with this emitter structure will be described with reference to FIGS. 3A to 3E and FIG. 4. FIG. 3A shows a pattern of a standard transistor. In this pattern, assuming emitter area $S_E=1$ and base area $S_B=6$, in order to double the emitter area of the standard transistor, conventionally, the length of the emitter region is increased as shown in FIG. 3D so that $S_E=2$. Since the overall length of the transistor region must also be increased, the base region is also doubled and base area $S'_B=12$. In contrast to this, FIG. 3B shows a pattern with $S_E=2$ according to the embodiment of the present invention. In this pattern, as can be seen from FIG. 2B, although the transistor region is wider, external base region 55 between emitter regions $56_1$ and $56_2$ is commonly used for both regions $56_1$ and $56_2$. Therefore, base area $S_B$ (=9) need not be doubled.

In the above embodiment, there are 2 emitter regions. However, 3 or more emitter regions can be formed.

Figure 3C:
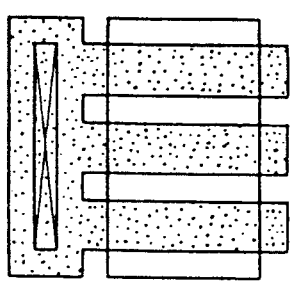
Figure 3E:
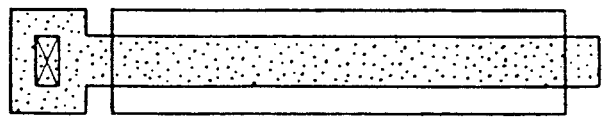

FIG. 3C shows a transistor pattern having 3 emitter regions when $S_E=3$. FIG. 3E shows a conventional transistor when $S_E=3$. As can be seen from a comparison of these two figures, $S_B$ is limited to 15 in the transistor of the present invention while it is 18 in the conventional transistor. Thus the effect of limiting $S_B$ upon an increase of $S_E$ becomes larger as $S_E$ increases.

FIG. 4 shows a graph of the value of $S'_B/S_B$. The effect of the present invention can easily be seen from this graph.

As described above, according to the present invention, since the emitter region can be enlarged without unnecessarily enlarging the base region, the gain hfe of the transistor can be maintained at its initial value and at the same time the transistor can be used with a large current.

As can be seen from a comparison of FIGS. 3B and 3D, the NPN transistor of the present invention has effective high-frequency characteristics in a large current region. In a conventional transistor, when $S_E$ is doubled, the length of the emitter electrode is doubled, the emitter resistance is increased, and high-frequency characteristics in a large current region are impaired. In contrast to this, in the NPN transistor of the present invention, two emitter electrodes $58_1$ and $58_2$ are connected in parallel to each other. When the resistance of each electrode $58_1$ to $58_2$ is represented by R, the combined resistance R' of the emitters is $1/R'=(1/R)+(1/R)$, which is less than in a conventional transistor.

The present invention is advantageous over conventional devices in that the dimensions of the NPN transistor can be reduced. More specifically, since the emitter electrode of a laminated layer formed of a polysilicon layer and a metal silicide layer laminated on the polysilicon layer, so called, polycide layer, a laminated layer formed of a polysilicon layer and a refractory metal layer laminated on the polysilicon layer, or a metal silicide layer and the emitter electrode of an aluminum based layer are connected outside the transistor region, even if contact region 58 is large, the transistor dimensions can still be kept small. In conventional transistors, the contact hole of the base electrode must be formed with a sufficient two-dimensional margin with respect to the transistor region and thus requires an extra area.

FIG. 5 shows a pattern of an NPN transistor according to another embodiment of the present invention. One end of each of two emitter electrodes $58_1$ and $58_2$ is formed integrally from patterned layer 58 as in FIG. 2A, and the other end is also integrally connected by patterned layer 58' formed of a laminated layer of a polysilicon layer and a metal silicide layer, so called, polycide layer, a laminated layer of a polysilicon layer and a refractory metal layer, or a metal silicide layer. Emitter electrodes are similarly connected to layer 58' by an aluminum based wiring metal. In the embodiment shown in FIG. 5, an emitter current flows to both emitter electrodes $58_1$ and $58_2$. Therefore, the emitter resistance is decreased to one half, and the voltage drop at the emitter electrodes is reduced. As a result, the high speed operation characteristics in a high current region and device reliability are improved.

Figure 6A:
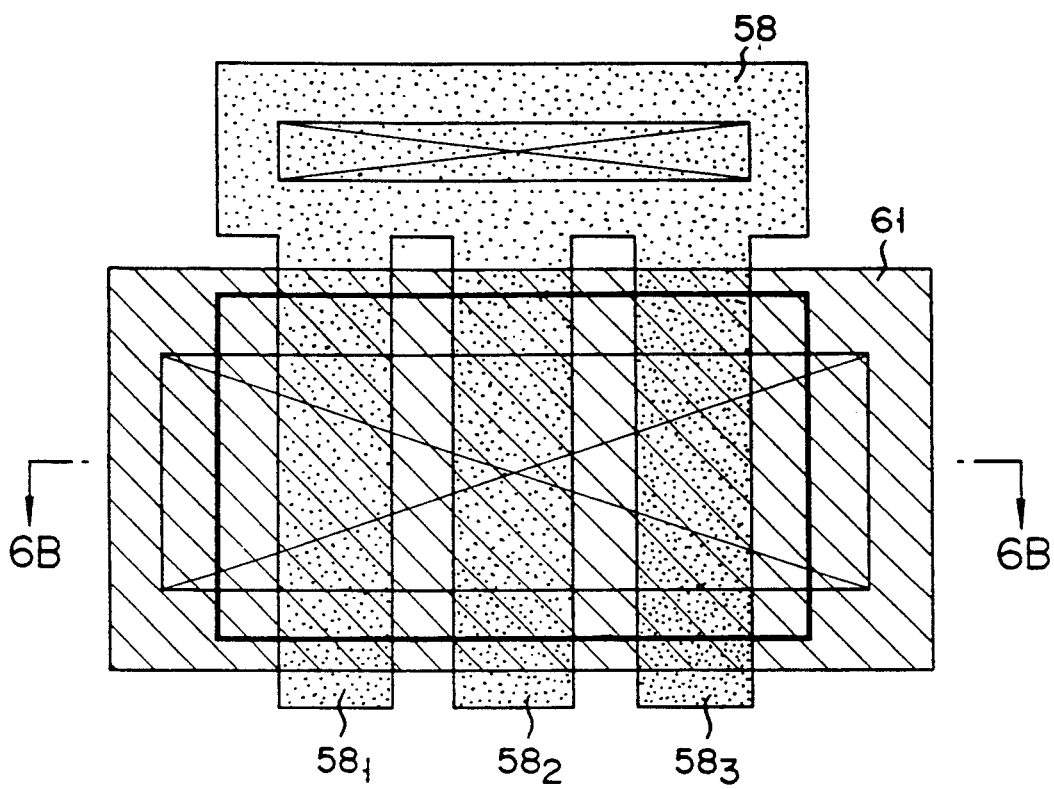
FIGS. 6A and 6B are a plan view and a sectional view, respectively, of an emitter of a semiconductor device according to another embodiment of the present invention.
Figure 6B:
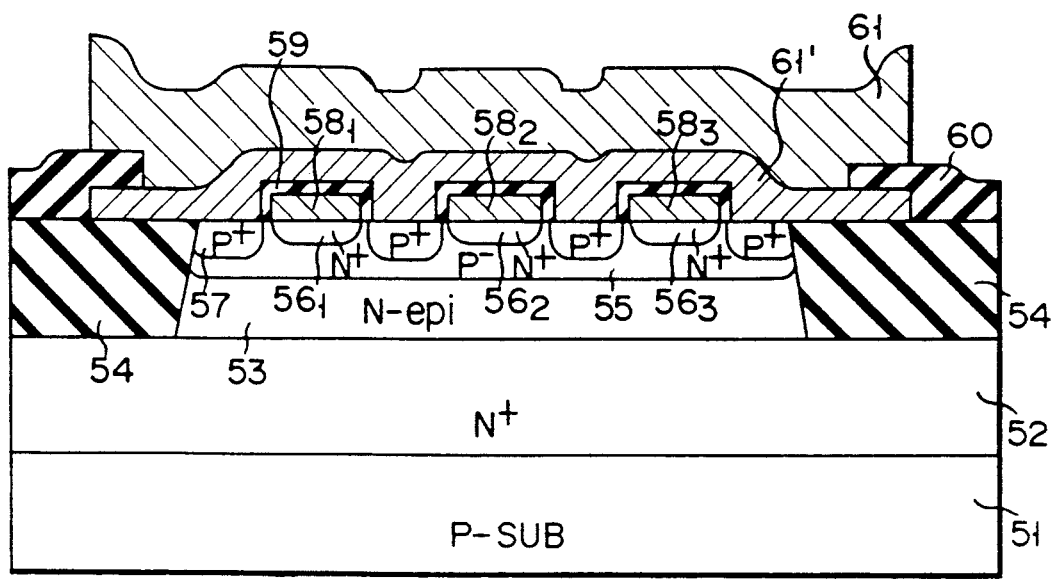

FIG. 6A and 6B show still another embodiment of the present invention. In this embodiment, three emitter regions $56_1$, $56_2$ and $56_3$ are formed, and three emitter electrodes $58_1$, $58_2$ and $58_3$ are arranged for these emitter regions. A base electrode formed by the over locos method comprises a laminated electrode of boron-doped polysilicon layer 61' and aluminum based wiring metal layer 61. P+-type external base region 57 is formed in region 55 using layer 61' as a diffusion source. With this structure, short-circuiting between the base and collector due to electrode-penetration that the base electrode penetrates the base region can be prevented. In the embodiment shown in FIGS. 2A and 2B, when base electrode 61 is directly connected to external base region 57 by an aluminum based wiring metal and metallized, the aluminum based wiring metal can migrate into the silicon layer and cause breakdown at the base-collector junction. In contrast to this, in the embodiment shown in FIGS. 6A and 6B, since base electrode 61' comprising a polysilicon layer is formed below the base electrode comprising an aluminum based wiring metal, base electrode 61' prevents the migration of metal ions into the silicon layer and subsequent breakdown at the base-collector junction.

In the above embodiments, if a polycide obtained by laminating a metal silicide on a polysilicon layer, a laminated layer of a refractory metal film and a polysilicon layer, a metal silicide layer, or a refractory metal film alone is used for emitter electrodes $58_1$, $58_2$, $58_3$, 58 and 58', the emitter resistance can be further reduced. When a refractory metal film is used, emitter regions are not formed in self-alignment using emitter electrodes as a diffusion source.

The material for the emitter electrodes can be a polysilicon layer, a polycide layer, a film of a refractory metal such as tungsten, titanium or molybdenum, or a laminated structure of such a refractory metal film formed on a polysilicon layer. The base electrode can comprise not only a laminated layer formed of a polysilicon layer and an aluminum layer but also a laminated layer of a polysilicon layer and a metal silicide layer, so called, polycide layer, a laminated layer of a polysilicon layer and a refractory metal layer, or a metal silicide layer and a layer laminated with an aluminum layer thereon polysilicon or polycide.

Still another embodiment of the present invention will be described with reference to FIGS. 7A to 7K.

In the process shown in FIG. 7A, an N-type impurity such as Sb is selectively diffused from the surface of P-type silicon substrate 71 to form N+-type buried region $72_1$ for a vertical NPN transistor and N+-type buried region $72_2$ for an I$^2$L element. Thereafter, N-type epitaxial silicon layer 73 is formed on the entire surface including regions $72_1$ and $72_2$. Layer 73 has an impurity concentration of $10^{15}$ to $10^{16}$/cm$^2$ and a thickness of 1 to 3 μm. Thermal oxide insulating layer 74 is formed on the surface of layer 73. Opening windows for forming isolation regions are selectively formed in insulating layer 74. Boron-doped silicon oxide layer (BSG layer) 75 is deposited on the entire surface of insulating layer 74 including the windows. Boron is selectively diffused into layer 73 using BSG layer 75 as a diffusion source to form P+-type isolation region 76 for isolating the NPN transistor and the I$^2$L element in layer 73.

In this isolation process, the ion-implantation of boron and thermal diffusion can be simultaneously performed depending on the impurity concentration and diffusion depth of P+-type isolation region 76.

In the process shown in FIG. 7B, after BSG (boron silicate glass) layer 75 and thermal oxide insulating layer 74 are removed, another thermal oxide insulating layer 77 is formed on layer 73, and a window opening for forming collector region 79 for the vertical NPN transistor is formed in layer 77. Phosphosilicate glass layer (PSG layer) 78 is deposited on the entire surface of layer 77 including the window. Phosphorus is selectively diffused in epi-layer 73, using PSG layer 78 as a diffusion source to form N+-type collector contact region 79 extending to region $72_1$. In this process, an N+-type diffusion region extending to region $72_2$, i.e., an emitter contact region (not shown) for the I$^2$L element is also formed. In this case, phosphorus is diffused by a combination of ion-implantation and thermal diffusion.

In the process shown in FIG. 7D, epitaxial layer 73 is selectively etched and oxidized using silicon nitride layer 81 as an anti-oxidation mask to form field oxide layer 82, oxide isolation layer $83_1$ and oxide isolation layer $83_2$ in layer 73. Layer 82 is a buried oxide layer having a thickness of 8,000 to 10,000 Å and serves to isolate elements. Layer $83_1$ gives the NPN transistor a sidewall contact structure. Layer $83_2$ isolates the injector transistor and two output transistors of the I$^2$L element. After silicon nitride layer 81 (antioxidation mask) and oxide layer 80 are removed, the surfaces of the element regions are thermally oxidized and thermal oxide layer 84 having a thickness of 500 to 1,000 Å is formed.

In the selective oxidation process described above, buried oxide regions 82, $83_1$ and $83_2$ must extend as far as N+-type buried regions $72_1$ and $72_2$ in order to isolate the gates the high speed I$^2$L elements.

In the process shown in FIG. 7E, boron ions are injected in a region for forming an injector transistor for the I$^2$L element using thermal oxide layer 84 as a buffer layer and a patterned photoresist layer as a mask to form P+-type emitter region 85 and P+-type collector region 86 in the I$^2$L element fabricating region to be isolated from each other. In order to form regions 87, $88_1$ and $88_2$, boron ions are alternately injected into corresponding surface regions using separate photoresist layers. Thermal oxide layer 84, covering prospective active base region 87 of the NPN transistor, and thermal oxide layer 88, covering the surfaces of prospective active base regions $88_1$ and $88_2$ of the I$^2$L element, are selectively etched.

In the process shown in FIG. 7F, undoped polysilicon layer 89 is deposited to a thickness of 500 to 2,000 Å on the entire surface of the semiconductor device shown in FIG. 7E. Thereafter, arsenic is doped in polysilicon layer 89 at a dose of 2 to $20 \times 10^{15}$ cm$^{-2}$. Refractory metal silicide (e.g., MoSi$_2$) layer 90 having a thickness of 1,000 to 3,000 Å is formed on the entire surface of layer 89. SiO$_2$ layer 91 is formed on the entire surface of layer 90 by the CVD method. The resultant semiconductor structure is annealed at about 900° C. so that the impurity ions in the polysilicon layer are uniformly distributed.

When annealing is performed at about 900° C., arsenic in the polycide is not doped in the epitaxial layer.

In the process shown in FIG. 7G, a stacked structure of a polycide layer and an SiO$_2$ layer is patterned by selective etching to form, on the stacked structure, emitter electrode pattern 92 and collector electrode pattern 93 for the NPN transistor and collector electrode patterns $94_1$ and $94_2$ for the I²L element. Upon this patterning, input wiring pattern 95, jumper wiring pattern 96, and mask pattern 97 for emitter region 85 and collector region 86 of a lateral PNP injector transistor are simultaneously formed on the stacked structure. Thereafter, SiO₂ layer 98 having a thickness of 3,000 to 5,000 Å is formed on the entire surface of the semiconductor structure including the patterned layers by the plasma CVD method.

In the process shown in FIG. 7H, SiO₂ layer 98 is etched by a distance corresponding to its thickness by anisotropic etching using RIE (reactive ion etching) to remove all of SiO₂ layer 98 except for portions on the side walls of polycide patterns 92, 93, $94_1$, $94_2$, 95, 96 and 97. These polycide patterns are thus covered by SiO₂ layers 91 and 98.

Thin thermal oxide layer 84, covering the surface of the injector transistor fabricating regions in the I²L element, is removed by RIE except for a portion covered by mask pattern 97.

In the process shown in FIG. 7I, undoped polysilicon layer 99 is deposited on the entire surface of the semiconductor structure shown in FIG. 7H. Boron ions are then injected into polysilicon layer 99.

Figure 7J:
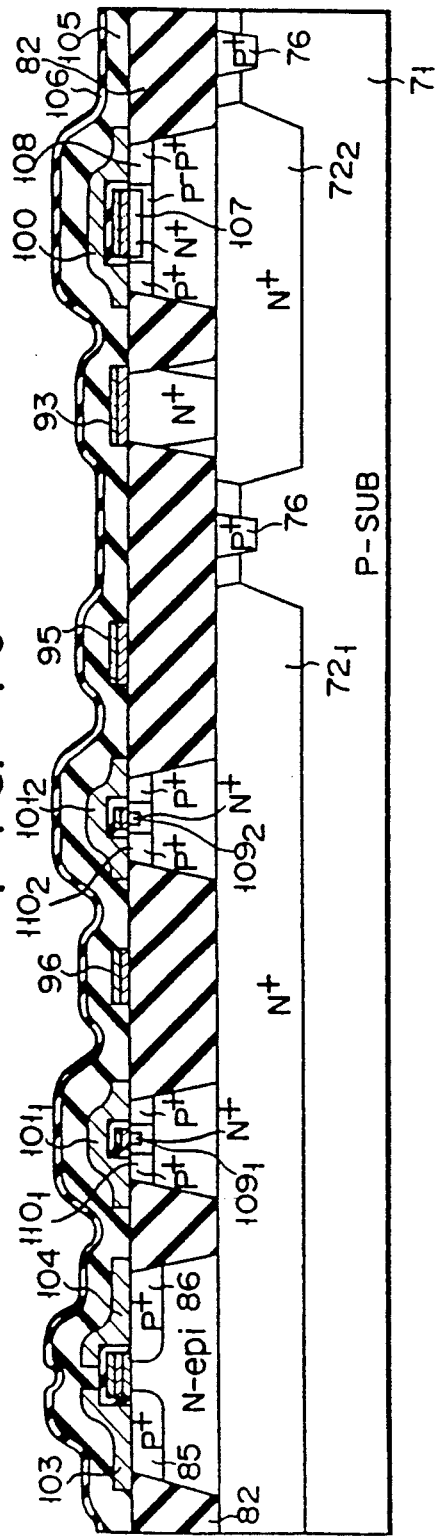

In the process shown in FIG. 7J, layer 99 is patterned by selective etching to form, in layer 99, base electrode pattern 100 for the vertical NPN transistor, base electrode patterns $101_1$ and $101_2$ for the I²L element, and emitter electrode pattern 103 and collector electrode pattern 104 for the injector PNP transistor. These electrode patterns cross over the polycide electrode patterns through SiO₂ layers 91 and 98 and extend over the buried oxide films by the over locos method.

A thin thermal oxide layer, SiO₂ layer 105 and silicon nitride layer 106 are stacked as an interlayer insulator. Arsenic is then diffused in a corresponding region using the polycide patterns as a diffusion source in an atmosphere at 900° to 1,000° C., and at the same time boron is diffused in a corresponding region using the polysilicon patterns as a diffusion source. Then, N⁺-type emitter region 107 and P⁺-type external base region 108 for the vertical NPN transistor, and N⁺-type collector regions $109_1$ and $109_2$ and P⁺-type base regions $110_1$ and $110_2$ for the I²L element are formed.

Figure 7K:
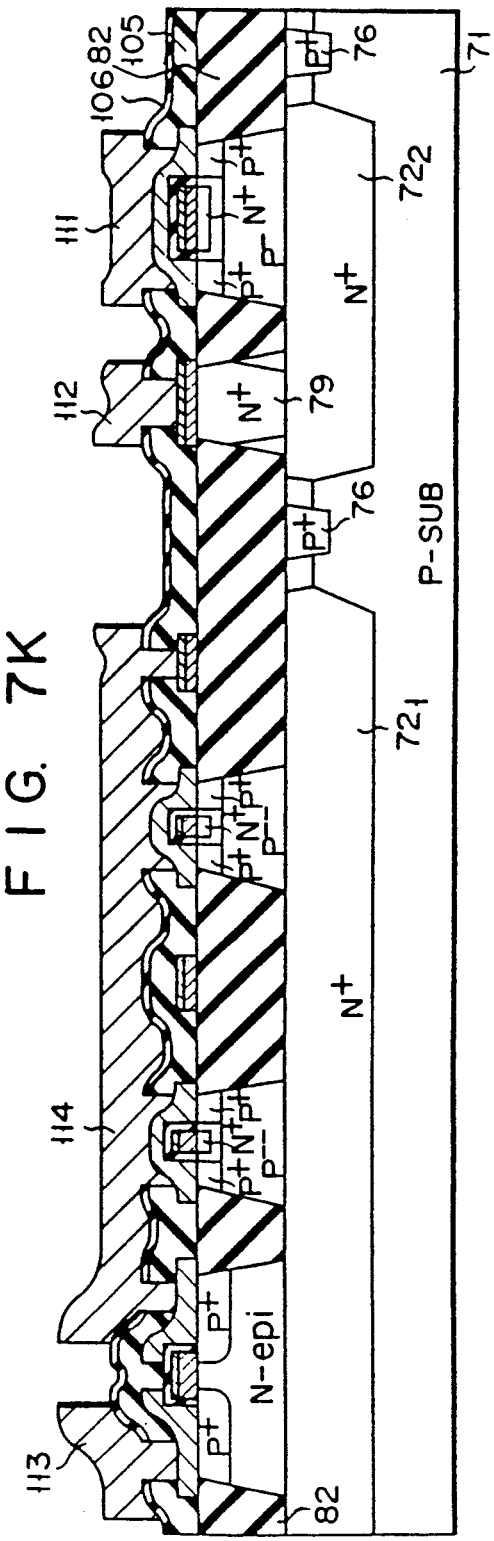

In the process shown in FIG. 7K, after contact holes are formed in the stacked structure of layers 105 and 106, an aluminum based metal wiring layer is deposited and metal wiring patterns 111 to 114 are patterned. Terminal 111 is a base terminal for the vertical NPN transistor, and terminal 112 is a collector terminal thereof. Terminal 113 is an injector terminal for the I²L element, and terminal 114 is a common input wiring pattern thereof.

Figure 8:
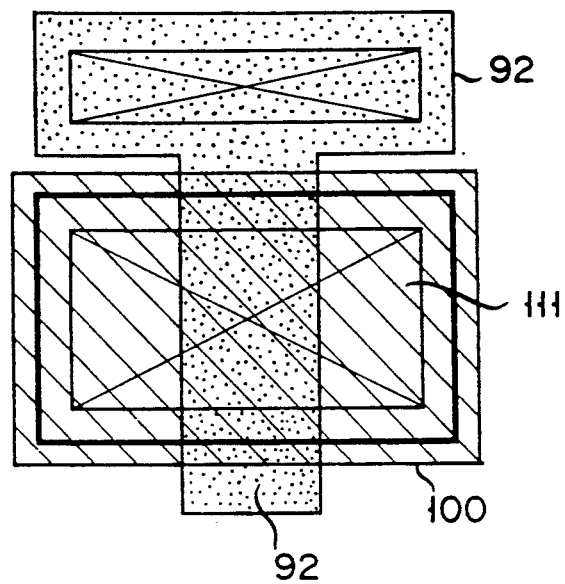
FIG. 8 is a plan view of an emitter of the bipolar transistor shown in FIG. 7K.

The emitter metal wiring pattern of the vertical NPN transistor is not shown in FIG. 7K. However, as shown in FIG. 8, polycide emitter electrode pattern 92 extends from below polysilicon base electrode pattern 100 onto the buried oxide films, and a metal wiring pattern is formed in contact with the resultant contact region.

Figure 9:
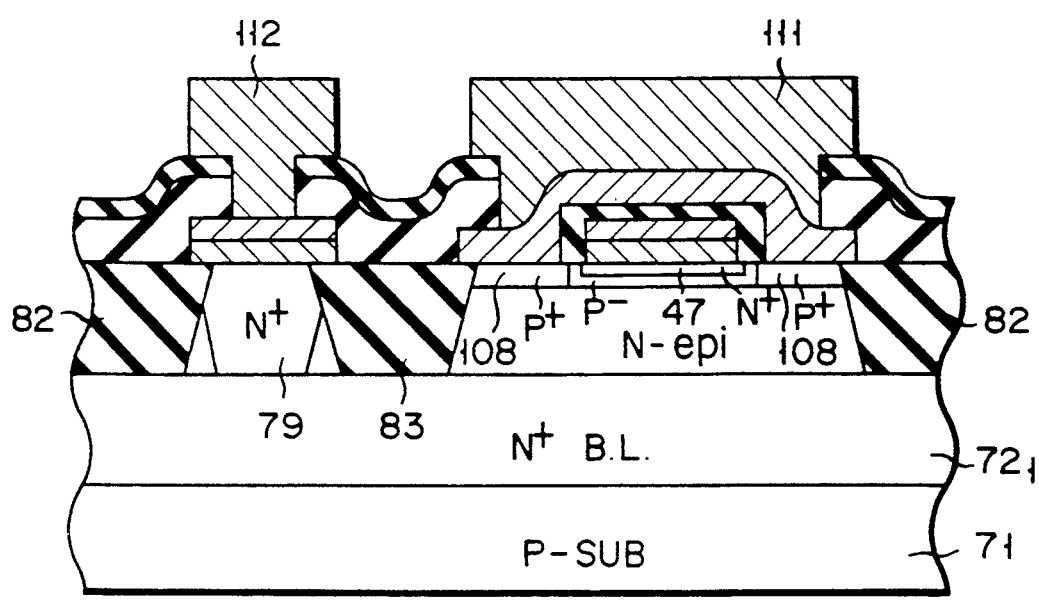
FIG. 9 is a sectional view of a bipolar transistor of the semiconductor device shown in FIG. 7K.

In the processes shown in FIGS. 7A to 7K, external base regions 108, $110_1$, and $110_2$ are formed in corresponding semiconductor regions using polysilicon base electrode patterns 100 and $101_1$ and $101_2$ formed by the over locos method as a diffusion source. Therefore, the emitter-to-base distance of the vertical NPN transistor, and the collector-to-external base distance of the I²L element can be reduced to a minimum within an allowable breakdown voltage range. In the vertical NPN transistor shown in FIG. 9, N⁺-type emitter region 107 and P⁺-type external base region 108 are formed in self-alignment using electrode patterns 92 and 100 as a diffusion source. Therefore, a mask alignment margin is not necessary for forming external base regions, unlike in conventional semiconductor devices. The collector-to-external base distance can be reduced within an allowable breakdown voltage range in accordance with the thickness of the SiO₂ layer formed on the side walls of pattern 92 and the diffusion conditions. As a result, the base resistance is reduced, and the high speed operation characteristics of the transistor are improved.

In addition, breakdown of the collector-base junction due to electrode penetration in the metal wiring can be prevented. In a conventional device, since a base electrode of an aluminum based metal is formed in contact with the external base region, metal migration causes junction breakdown. In this embodiment, however, since polysilicon electrode pattern 100 is formed between base electrode wiring pattern 111 and external base region 108, both of which are formed of polysilicon, metal migration to the epitaxial layer can be prevented.

Since the dimensions of the emitter region can be reduced to the resolution limit, the high speed characteristics of the transistor device are improved. This is because when the base electrode has a structure as described above, emitter electrode pattern 92 of a polycide is formed on a field oxide layer which has a contact region with the metal wiring pattern not associated with the junction capacity.

In the above embodiment, the method of forming an active base region can be modified as follows.

According to one modification, in the process shown in FIG. 7F, after polysilicon layer 89 is formed, boron ions are injected into corresponding regions through layer 89 to form active base regions 87, $88_1$ and $88_2$. With this method, a thin diffusion film can be easily formed by adjusting the thickness of polysilicon layer 89, and layer 89 serves as a buffer layer for lessening damage upon ion-implantation. Therefore, the diffusion depth of active base regions 87, $88_1$ and $88_2$ can be controlled to be shallow with high precision.

According to a second modification, not only arsenic but also boron is doped in a polycide layer used as a diffusion source for forming N⁺-type emitter region 107 for the NPN transistor, and N⁺-type collector regions $109_1$ and $109_2$ for the I²L element. Thus, when the emitter of the vertical NPN transistor and the collector regions for the I²L element are formed, boron is diffused to form the active base region. Although only the active base can be performed by this method, this method can be combined with a method of forming an active base region as in the embodiment described above. In this case, the diffusion profile of the transistor is different from that in the above embodiment.

Figure 10C:
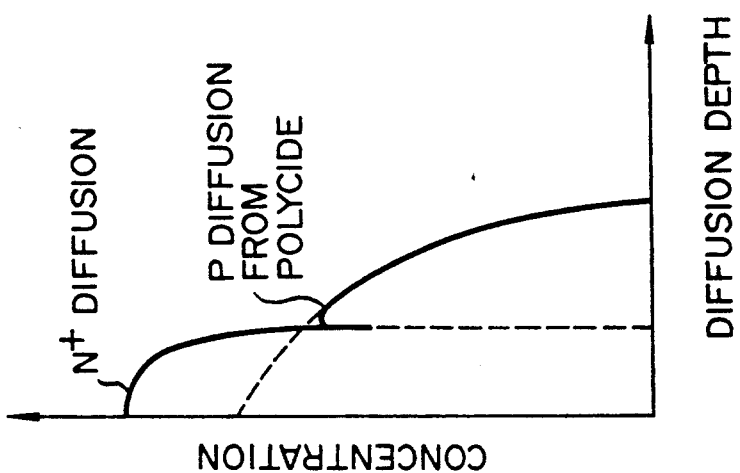
FIGS. 10A to 10C are graphs showing the concentration profiles in bipolar transistors obtained by various manufacturing methods.
Figure 10B:
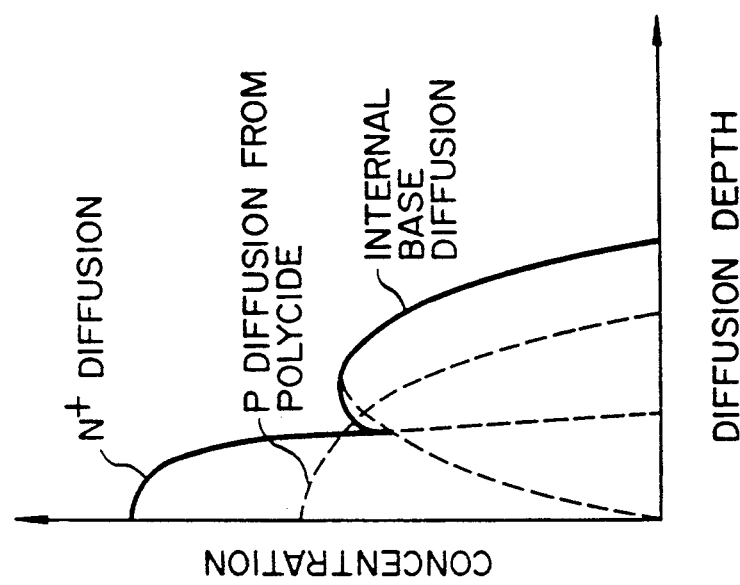
Figure 10A:
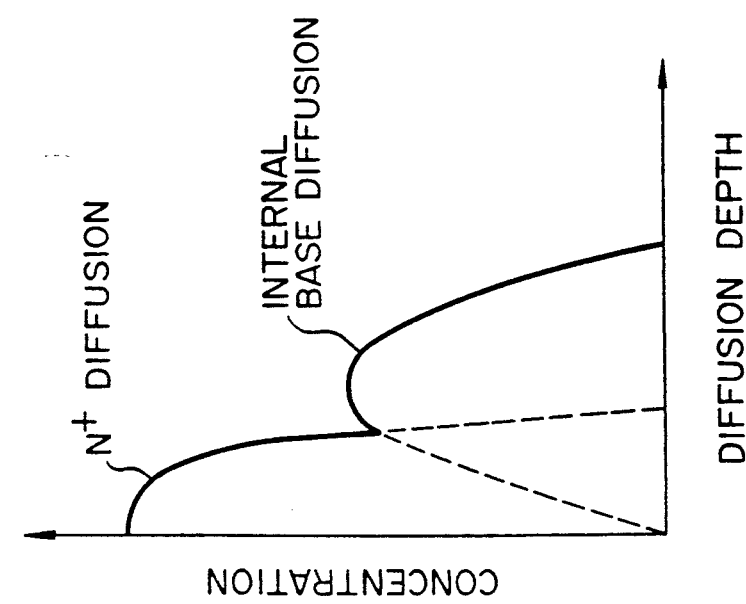

FIG. 10A shows the impurity concentration profile when an active base region is formed in advance and only arsenic from the polycide pattern is diffused into the base region. FIG. 10B shows the impurity concentration profile when an active base region is formed in advance and arsenic and boron are both diffused from a polycide pattern into the base region. FIG. 10C shows the impurity concentration profile when an active base region is not formed in advance, and arsenic and boron are diffused into an active base region fabricating region from a polycide pattern.

The method according to the profile in FIG. 10A provides good controllability of the diffusion profile. However, this method does not allow formation of a very shallow base junction, e.g., an active base region of 0.2 μm or less.

With the method according to the profile in FIG. 10B, control of the diffusion profile, i.e., control of the dose of the impurity injected into a polycide layer, is difficult. However, a very shallow base region can be formed in order to achieve high speed operation characteristics.

With the method according to the profile in FIG. 10C, while the impurity profile is maintained in an ideal condition from a preformed active base region, boron is diffused into the base region from a polycide layer. Therefore, the profile of double diffusion near the surface of the base region is stable. When diffusion of arsenic is controlled, the penetration of emitter diffusion through the base diffusion region can be prevented. Accordingly, which one of the three methods for forming an active region is to be adopted is selected in accordance with the required characteristics of the semiconductor device to be fabricated.

Figure 11:
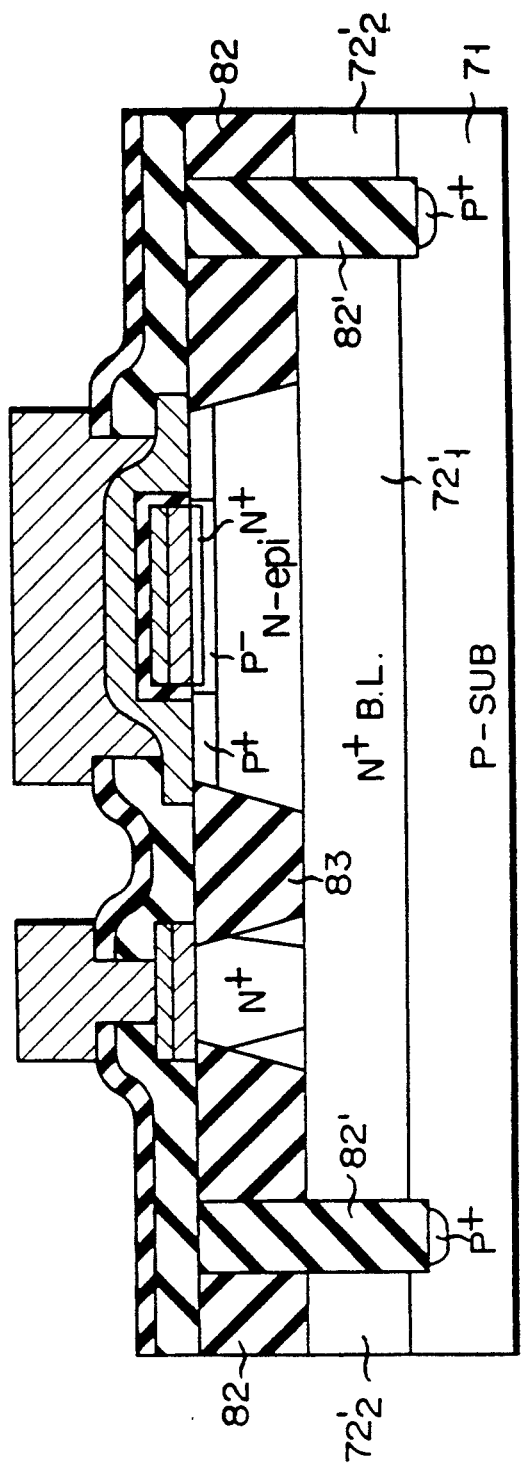
FIG. 11 is a sectional view of a bipolar transistor obtained by another manufacturing method.

As a modification of the embodiment shown in FIGS. 7A to 7K, the processes up to element isolation (FIGS. 7A to 7D) can be replaced with the following method. More specifically, instead of forming isolated N+-type buried regions $72_1$ and $72_2$ in a surface region of a substrate, N+-type buried region 72' is formed in the entire surface of a substrate (FIG. 11). Next, N-type epitaxial silicon layer 73 is formed on the surface of the substrate. Thereafter, a trench for isolating the vertical NPN transistor fabricating region and the I²L element fabricating region is formed in the substrate to be deeper than region 72'. Region 72' is thus isolated into the vertical NPN transistor fabricating region and the I²L element fabricating region. Boron is then doped into the substrate from the bottom of the trench to form P+-type diffusion isolation layer 76. Thereafter, a thin thermal oxide layer is formed on the wall surfaces of the trench and polysilicon layer 82' is buried therein. Field oxide layer 82 and oxide isolation layers 83 and 83' are formed in the substrate by selective diffusion, as in the earlier embodiments.

A method of manufacturing a bipolar semiconductor device according to another embodiment of the present invention will be described with reference to FIGS. 12A to 12F.

In the process for obtaining a semiconductor structure shown in FIG. 12A, and N-type impurity (e.g., Sb) is selectively diffused into P-type silicon substrate 121 from its surface, to form N+-type buried region $122_1$ for the vertical NPN transistor and N+-type buried region $122_2$ for the I²L element. Thereafter, N-type epitaxial layer 123 is grown on the entire surface of the substrate including buried regions $122_1$ and $122_2$. A P-type impurity such as boron is selectively diffused into layer 123 so as to form P+-type isolation layers 124 for isolating the NPN transistor and I²L element. An N-type impurity such as phosphorus is selectively diffused in layer 123 so as to form an N+-type diffusion region reaching region $122_1$, i.e., collector contact region 125 of the NPN transistor, and an N+-type diffusion region reaching region $122_2$, i.e., a common emitter contact region of the I²L element.

In the process for obtaining the semiconductor structure shown in FIG. 12B, field oxide layers 126 reaching regions $122_1$ and $122_2$ are formed in epitaxial layer 123 by selective diffusion. Field oxide layers 126 isolate circuit elements such as the NPN transistors and the I²L elements.

Oxide isolation layer $127_1$ for providing an NPN transistor of a sidewall base contact structure and oxide isolation layer $127_2$ for isolating two inverter transistors of the I²L element are formed in layer 123. Isolation layers 126 and $127_1$ and $127_2$ can be formed simultaneously as illustrated, or separately.

Thin thermal oxide layer 128 having a thickness of 500 to 1,000 Å is formed on the surface of layer 123. Layer 128 is selectively etched so as to form windows 129 for emitter diffusion and for removing the oxide layer portion in the collector region forming area of the I²L element.

In order to form a vertical NPN transistor of sidewall contact structure, emitter diffusion window 129 is formed to reach field oxide layer 126. In order to form an inverter transistor of sidewall base contact structure in the I²L element, collector diffusion windows are formed extending to oxide layers 126 and $127_2$.

In the process for obtaining the semiconductor structure shown in FIG. 12C, undoped polysilicon layer 130 having a thickness of 500 to 2,000 Å is deposited on the entire surface of the resultant structure shown in FIG. 12B by the CVD method. Arsenic is then doped in layer 130 as an impurity by ion-implantation. The impurity can be phosphorus or phosphorus and arsenic.

Refractory metal silicide layer 131 having a thickness of 1,000 to 3,000 Å is deposited on the entire surface of layer 130. Boron is doped in layer 131 as an impurity by ion-implantation. In this case, ion-implantation for the vertical NPN transistor fabricating area and for the I²L element fabricating area is performed separately to provide desired doses for the respective areas. If required, a SiO₂ layer having a thickness of 2,000 Å is formed on the entire surface of doped silicide layer 131. In order to provide a uniform impurity profile, the SiO₂ layer is annealed at 800° to 900° C. A laminated layer of SiO₂ and the polycide layer is patterned by selective etching. Thus, emitter electrode pattern 132 for the NPN transistor, and collector electrode patterns $133_1$ and $133_2$ and input wiring pattern 134 for the I²L element are formed in the substrate, as shown in FIG. 12D. Jumper wiring patterns $135_1$ and $135_2$ and mask pattern $136_1$ for forming an injector region are then formed.

In FIG. 12D, in the inverter transistor fabricating area of the I²L element, collector electrode patterns $133_1$ and $133_2$ are not formed to extend on the buried oxide films. With this arrangement, the collector electrodes contact with the metal wiring layers at two sides of the collector electrodes and the base resistance is reduced. However, in a direction perpendicular to the section of the drawing, collector electrode patterns $133_1$ and $133_2$ extend on the buried oxide films in order to provide a sidewall emitter contact structure, as in the case of a vertical NPN transistor fabricating area.

In the process for obtaining the semiconductor structure shown in FIG. 12E, boron ions are injected into the epitaxial layer using polycide patterns 132, $133_1$, $133_2$, 134, $135_1$, $135_2$, and 136 and buried oxide films 126, $127_1$, and $127_2$ as a mask. Thereafter, P+-type external base region 137 for the NPN transistor and P+-type external base regions $138_1$ and $138_2$ and P+-type injector region 139 for the I²L element are formed in the epitaxial layer.

In the process for obtaining the semiconductor structure shown in FIG. 12F, boron and arsenic are thermally diffused into corresponding regions using polycide emitter electrode 132 and collector electrodes $133_1$ and $133_2$ as a diffusion source. After this diffusion process, P⁻-type active base region 140 for the NPN transistor and active base regions $141_1$ and $141_2$ for the I²L element are formed in the epitaxial regions, and N⁺-type emitter region 142 for the NPN transistor and N⁺-type collector regions $143_1$ and $143_2$ for the I²L element are formed in corresponding regions 140, $141_1$ and $141_2$.

SiO₂ layer 200 is removed, and another SiO₂ layer 144 is formed as an interlayer insulator on the surface of the semiconductor structure. Contact holes are selectively formed in insulator 144. An aluminum based layer is then formed on the entire surface of the insulator, and patterned to form electrode wiring patterns 145 to 149. Wiring patterns 145, 146 and 147 are emitter, base and collector terminals of the NPN transistor, respectively. Wiring pattern 148 is an injector terminal of the I²L element, and wiring pattern 149 is a common input wiring pattern thereof.

Figure 13:
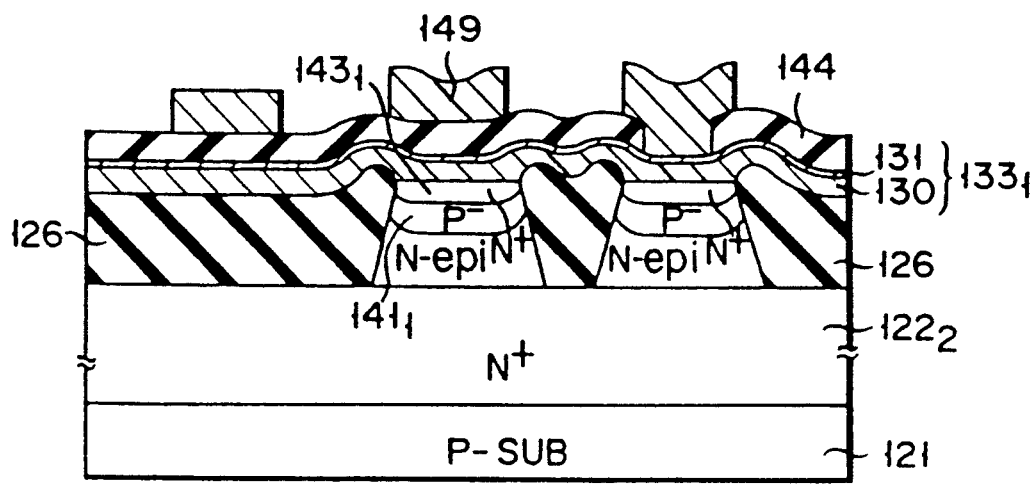
FIG. 13 is a sectional view of a semiconductor structure taken along the line 13—13 in FIG. 12F.

FIG. 13 shows a section of the structure shown in FIG. 12F along a line 13—13 therein: two adjacent I²L elements.

In the above embodiment, for each of the vertical NPN transistors and the I²L elements, an isoplanar II structure having a normal double diffusion profile near the buried oxide films can be obtained. In the process shown in FIG. 12B, when the diffusion window is formed, even if the edges of the field oxide layer and the oxide isolation layers are etched back, this does not adversely influence the device characteristics. For example, in the vertical NPN transistor, both P⁻-type active base region 140 and N⁺-type emitter region 142 are formed by diffusion of an impurity from emitter electrode pattern 131. Therefore, the diffusion profile near the end face of field oxide layer 126 is the same as in the remaining portion. For this reason, local variations in gain or short-circuiting of the emitter-collector are not caused.

Since the inverter transistor of the I²L element also has an isoplanar structure, it provides the same effect as that of the vertical NPN transistor. In addition, in the I²L element, the polycide pattern used as a diffusion source can then be used as wiring, thereby allowing versatile design and improving the operation speed of the inverter transistor of the I²L element.

A method of manufacturing a semiconductor according to another embodiment of the present invention will be described with reference to FIGS. 14A and 14B.

A semiconductor structure shown in FIG. 12A is obtained. Thereafter, the structure is selectively oxidized to form field oxide layer 126 and oxide isolation layers $127_1$ and $127_2$, as shown in FIG. 14A. Thermal oxide layer 128 is also formed in the element fabricating regions.

Boron ions are injected into the epitaxial layer using field oxide layer 126 and oxide isolation layers $127_1$ and $127_2$ as a mask. Thus, active base region 140' for the vertical NPN transistor and active base regions $141'_1$ and $141'_2$ for the I²L element are formed in the epitaxial layer. Selective etching is then performed to form emitter diffusion window 129 in thermal oxide layer 128 covering the active base region of the NPN transistor, and to remove the thermal oxide layer on the collector forming region of the I²L element. Thereafter, manufacturing is performed in accordance with the processes from FIGS. 12C to 12E, and a semiconductor device as shown in FIG. 14B is obtained.

Figure 15:
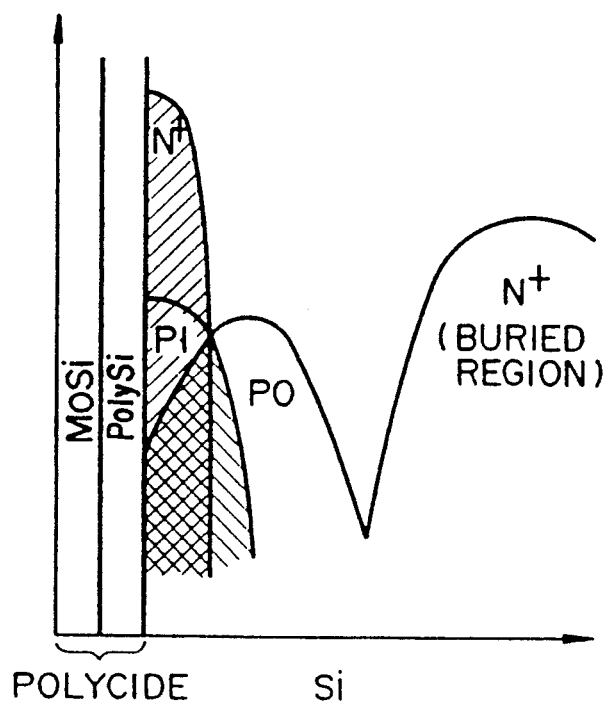
FIG. 15 is a graph showing the concentration profile of a bipolar transistor shown in FIG. 14B.

In the manufacturing method described above, since active base regions $141'_1$ and $141'_2$ are formed in the epitaxial layer by ion-implantation in advance, the diffusion profile of the ion-implanted regions is different from that shown in FIG. 12F. As shown in FIG. 15, the diffusion profile of the vertical NPN transistor in which boron is doped becomes $P_0$, while that of the transistor in which the boron diffusion is performed from the emitter electrode of a polycide becomes $P_1$. Thus, the vertical transistor of the semiconductor device shown in FIG. 14B has two profiles $P_0$ and $P_1$. With such profiles, since profile $P_0$ is corrected by profile $P_1$, an appropriate base width can be maintained near the field oxide layer. A uniform gain can thus be obtained, and short-circuiting between the emitter and base can be prevented.

In the above embodiment, I²L elements and linear transistors are formed in a single semiconductor substrate. However, the present invention can be similarly applied to a MOSFET. An embodiment wherein the present invention is applied to a MOSFET will be described with reference to FIGS. 16A to 16G.

Figure 16A:
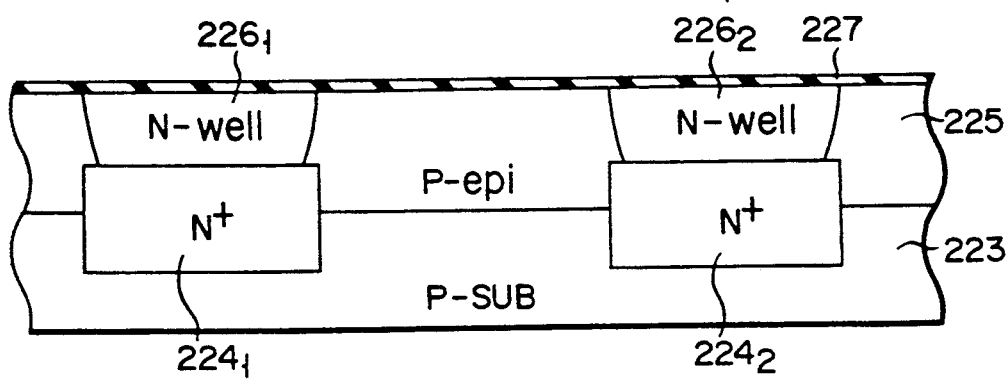
FIGS. 16A to 16G are sectional views of semiconductor structures obtained in the manufacturing processes of a semiconductor device including a MOSFET.

Referring to FIG. 16A, a diffusion mask oxide layer, e.g., a thermal oxide layer, is formed in p-type silicon substrate 223 having a concentraction of $10^{14}$ to $10^{17}$ cm⁻³, and is patterned. An impurity such as antimony or arsenic is diffused in substrate 223 using a diffusion mask to form N⁺-type buried regions $224_1$ and $224_2$ having a high concentration ($10^{18}$ to $10^{20}$ cm⁻²). After the oxide mask is entirely removed, P-type epitaxial layer 225 is deposited on the entire surface of the wafer. Epitaxial layer 225 has a thickness of 1 to 5 μm and a resistivity of 0.5 to 10 Ω.cm. These conditions are only an example, and may be varied in accordance with the required characteristics of the MOSFET or the like to be manufactured.

N-well regions $226_1$ and $226_2$ are formed as regions for forming a p-channel MOSFET and a bipolar transistor. In this case, thermal oxide layer 227 having a thickness of 500 to 1,000 Å is formed on the surface of the wafer. Thereafter, phosphorus ions are selectively ion-implanted at a dose of $2 \times 10^{12}$ cm⁻² and an acceleration voltage of 150 keV, so as to form a diffusion source. The phosphorus is then diffused to a depth of 1 to 3 μm in the subsequent thermal process to form n-well regions having a concentration of 8 to $10^{-15}$ cm⁻³ in P-type epitaxial layer 225. In this process, upward diffusion from buried regions $224_1$ and $224_2$ occurs, and the diffusion length of the n-well regions is shortened. Therefore, the thermal diffusion time is shortened, and formation of n-well regions is facilitated.

Figure 16B:
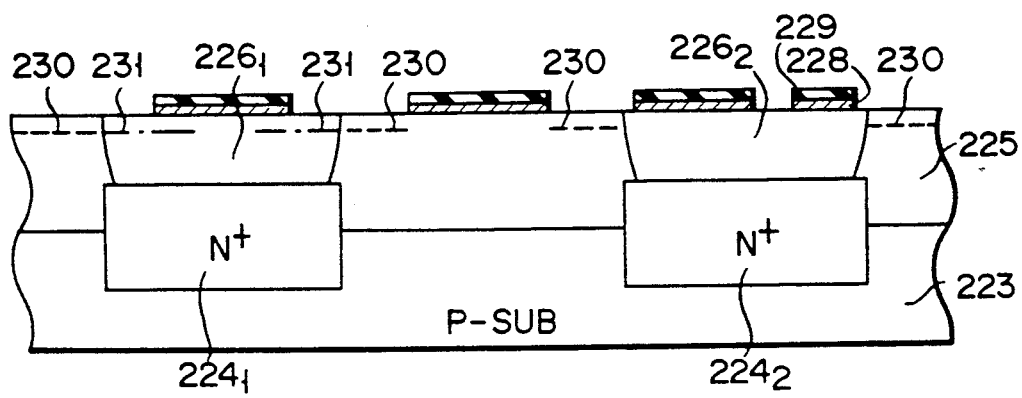

In the process shown in FIG. 16B, thermal oxide layer 228 having a thickness of 300 to 2,000 Å is formed on the entire surface of the wafer, and anti-oxidation insulation (e.g., SiN) film 229 having a thickness of 1,000 to 2,500 Å is deposited thereover. Layers 228 and 229 are patterned so as to form field regions. Thereafter boron or phosphorus ions are injected into layer 225 to form channel cut regions 230 and 231.

Figure 16C:
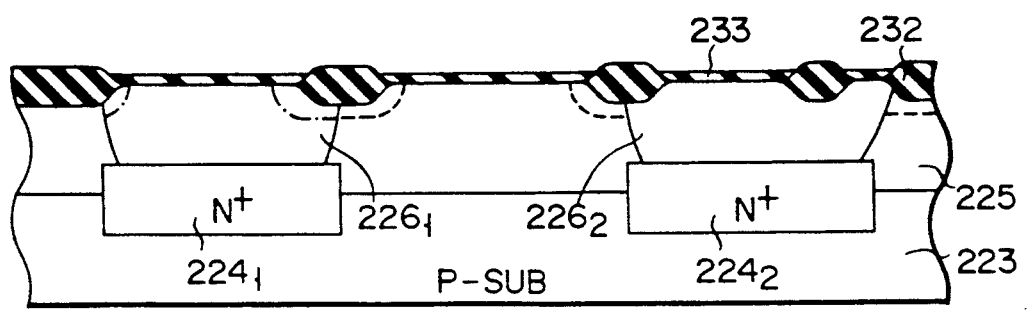

In the process shown in FIG. 16C, layer 225 is selectively oxidized using insulation layer 229 as a mask to form field insulation layer 232 having a thickness of about 0.7 to 1.2 μm. Thereafter, insulation layer 229 and thermal oxide layer 228 are removed, and thermal oxide layer 233 as a gate insulation layer of the MOSFET and having a thickness of 100 to 1,000 Å is formed.

Figure 16D:
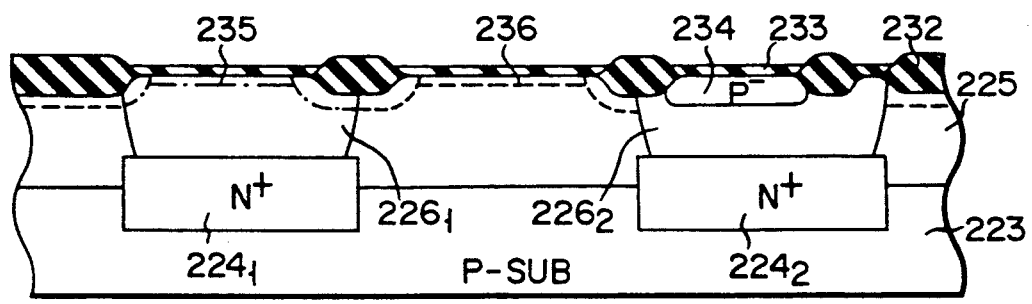

In the process in FIG. 16D, boron ions are injected into the bipolar transistor fabricating region using a photoresist layer and field oxide layer 232 as a mask. The structure is annealed. If required, thermal oxidation is performed at a temperature of about 1,000° C. Thereafter, active base region 234 having a sheet resistance of about 500 to 2,000 Ω/square is formed in n-well region $226_2$. If required, channel implantations 235 and 236 are formed in the wafer so as to determine the gate threshold voltage of the p- or n-channel MOSFET.

Figure 16E:
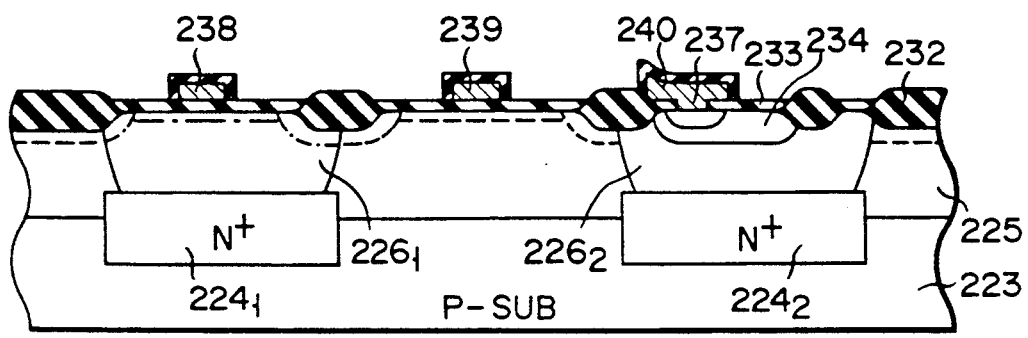

In the process shown in FIG. 16E, emitter diffusion window 237 is formed in insulation layer 233. Thereafter, an undoped polysilicon layer is formed to a thickness of 500 to 1,500 Å on the surface of the wafer, and arsenic is ion-implanted in the entire surface thereof. A metal silicide layer or a refractory metal layer is then formed on the polysilicon layer and heat-treated. with this heat-treatment, the polycide layer is formed and arsenic ions are uniformly distributed therein. The polycide layer formed in this manner preferably has a thickness of about 1,500 to 1,600 Å. The dose of arsenic ions is rendered uniform and is controlled to fall within the range of 2 to $6 \times 10^{20}$ cm$^{-3}$ within the layer. This dose range does not cause anomalous diffusion in a double diffusion layer or a decrease in yield when the arsenic ions are used as an emitter diffusion source for a bipolar transistor. According to another method which can be used in this process, in order to reduce the resistance of the layer, the polycide layer can be replaced with a silicide layer or a stacked structure of a silicide layer and a refractory metal layer formed thereon. In addition, arsenic ions as an emitter diffusion source can be doped at a concentration of 2 to $6 \times 10^{20}$ cm$^{-3}$ in the silicide layer.

According to still another method, after emitter diffusion window 237 is formed by patterning, ion-implantation of arsenic ions is performed at an acceleration voltage of about 50 keV before deposition of the insulation layer. Thereafter, a silicide layer, a refractory metal layer, or a laminated layer formed of a silicide layer and a refractory metal layer is deposited. If required, the wafer is heat-treated so as to activate arsenic ions in the emitter diffusion layer.

Various layers formed in this manner are patterned to form gate regions 238 and 239 of the MOSFET and emitter diffusion region 240 of the bipolar transistor. The impurity is diffused from region 240 to base region 234 and an emitter-base junction is formed.

Figure 16F:
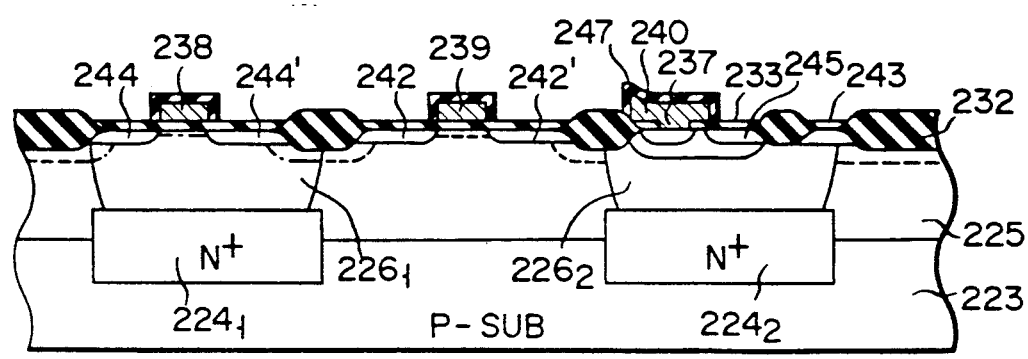

In the process shown in FIG. 16F, external base region 245 for the bipolar transistor is formed by ion-implantation of boron in the self-alignment method through layers of various structures simultaneously with source and drain regions 244 and 244' of the n-channel MOS transistor. In this time, a layer obtained by depositing a CVD oxide layer or a nitride layer on a layer of the above structure and then patterning the formed layer can be used for an ion-implantation mask. Alternatively, a photoresist layer used for patterning a layer of the above structure can be used for an ion-implantation mask.

If the surface layer can be thermally oxidized, i.e., if the layer is a polycide layer or a silicide layer, thermal oxide layer 247 is then formed in its surface.

Figure 16G:
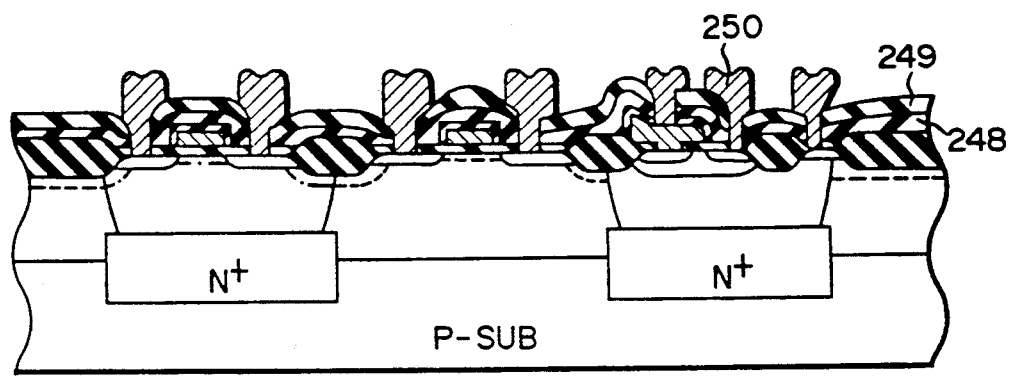

As shown in FIG. 16G, passivation films 248 and 249 are then formed, and contact holes for respective elements are formed in these films. Metal layer 250 is deposited and patterned, thereby completing the CMOS transistors and the bipolar transistor.

However, if the surface layer cannot be thermally oxidized, a thermal oxide layer is not formed and passivation films 248 and 249 are formed directly on the structure.

Figure 17:
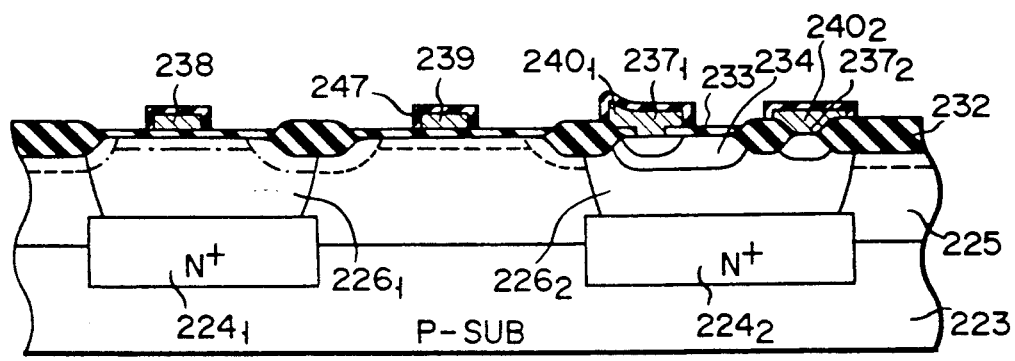
FIG. 17 is a sectional view of a semiconductor device obtained by another manufacturing method.
Figure 18:
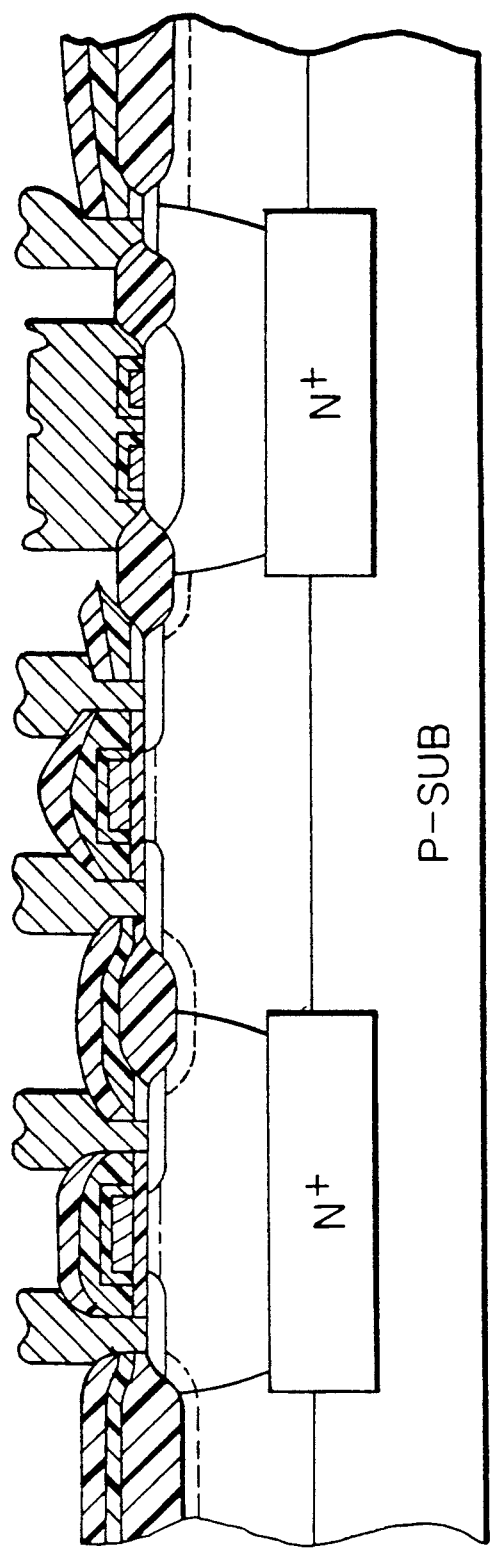
FIG. 18 is a sectional view of a semiconductor device including at least one bipolar transistor and plurality of MOS transistors according to another embodiment of the present invention.

As shown in FIG. 17, collector electrode $240_2$ of the bipolar transistor can have the same structure as emitter electrode $240_1$. Another step can be added to form a deep N+-type layer reaching N+-type buried region $224_2$ as collector region 243. In this case, the collector resistance is reduced.

When high-speed characteristics are sought by micronization of the bipolar transistor and MOSFET, in a bipolar transistor having an external base formed in self-alignment through an emitter electrode, a metal wiring cannot be directly connected to the narrow emitter electrode formed on the emitter diffusion region. In order to solve this problem, metal wiring is formed in a region other than the base diffusion region, as shown in FIG. 2A. In this case, high speed characteristics of a bipolar transistor are maintained by an emitter electrode of low resistance.

As described in the above embodiment, a gate electrode for the MOSFET and an emitter electrode for the bipolar transistor are polycide layers, silicide layers, refractory metal layers, or stacked structures of polysilicon and refractory metal layers. Therefore, the emitter resistance and the gate wiring resistance can be reduced, and both the MOSFET and bipolar transistor can operate at high speed. In addition, the source and drain regions of the MOSFET and the external base region of the bipolar transistor can be self-aligned. Since a material having a high melting point is used, the element can withstand relatively high temperatures in subsequent heat-treatment. Therefore, the overall manufacturing process can be simplified and rendered versatile.

In an element structure using an electrode doped with a high concentration of arsenic ions and in contact with an emitter diffusion region (as in the case wherein an emitter electrode is a polycide layer, a silicide layer, a stacked structure of a polysilicon layer and a refractory metal layer, or a stacked structure of a silicide layer and a refractory metal layer), when the emitter region is formed by thin diffusion as in the case of the polysilicon emitter region, a high gain can be obtained.

A polycide layer, a silicide layer, and a stacked structure of a polysilicon layer and a refractory metal layer have a sheet resistance of 1 to 5 Ω/square. A refractory metal layer and a stacked structure of a silicide layer and a refractory metal layer have a sheet resistance of 0.1 to 1 Ω/square. These sheet resistances are 1/100 to 1/1000 that of a polysilicon layer in which an impurity is doped to a high concentration.

The bipolar transistor coexisted with the MOSFET may be so fabricated as to be shown in FIGS. 7A to 7K, 12A to 12F, or 14A and 14B. Further, if separation between elements is required, P diffusion or the trench shown in FIG. 11 may be used.

What is claimed is:
1. A semiconductor device including at least one bipolar transistor and a plurality of MOS transistors of first and second type, the MOS transistors having gate electrode layers, comprising:
a base region of a first conductivity type of the bipolar transistor, and having a surface area;

at least two emitter regions of a second conductivity type, formed in the base region;

an emitter electrode layer having an impurity of the second conductivity type doped therein, the at least two emitter regions being formed by diffusion of the impurity of the second conductivity type from the emitter electrode layer into the surface area of the base region and the emitter electrode layer having at least two first portions spaced apart from and parallel to each other, and at least one second portion, the two first portions being in contact with the emitter regions, and extending beyond the surface area of the base region, the two first portions being connected electrically to each other at their end parts by the second portion, to connect the at least two emitter regions to each other electrically; and both the emitter electrode layer and the gate electrode layers of the MOS transistors being simultaneously formed, wherein the emitter electrode layer and the gate electrode layers are each made of a polycide layer formed of a polysilicon layer and a metal silicide layer laminated on the polysilicon layer.

2. The semiconductor device according to claim 1, which includes:

a semiconductor substrate of the first conductivity type;

a semiconductor layer of the second conductivity type formed on the semiconductor substrate;

first semiconductor regions of the second conductivity type selectively formed in the semiconductor layer of the second conductivity type;

second semiconductor regions of the first conductivity type, which extend from a surface of the semiconductor layer of the second conductivity type to the first semiconductor regions;

a field insulation layer formed in the semiconductor layer, and surrounding the base region; and a base electrode layer insulatively disposed over the emitter electrode layer and being in contact with the surface area of the base region;

said emitter electrode layer extending from the base electrode layer to the field insulation layer.

3. The semiconductor device according to claim 1, wherein the base electrode layer has an impurity of the first conductivity type doped therein, and is in contact with the surface area of the base region, at least one base contact region being formed by diffusion of the impurity of the first conductivity type from the base electrode layer into the surface area of the base region.

4. The semiconductor device according to claim 2, where the base electrode layer is made of a refractory metal layer.

5. The semiconductor device according to claim 2, wherein the base electrode layer is made of a metal silicide layer.

6. The semiconductor device according to claim 3, wherein the base electrode layer is made of a laminated layer of a polysilicon layer under a refractory metal layer.

7. The semiconductor device according to claim 3, wherein the base electrode layer is made of a polysilicon layer.

8. The semiconductor device according to claim 3, wherein the base electrode layer is made of a polycide layer formed of a polysilicon layer with a metal silicide layer laminated thereon.

9. The semiconductor device according to claim 3, wherein the base electrode layer is made of a stacked layer formed of a polysilicon layer with a refractory metal layer laminated thereon.

10. A semiconductor device including at least one bipolar transistor and a plurality of MOS transistors of first and second type, the MOS transistors having gate electrode layers, comprising:

a base region of a first conductivity type of the bipolar transistor, and having a surface area;

at least two emitter regions of a second conductivity type, formed in the base region;

an emitter electrode layer having an impurity of the second conductivity type doped therein, the at least two emitter regions being formed by diffusion of the impurity of the second conductivity type from the emitter electrode layer into the surface area of the base region and the emitter electrode layer having at least two first portions spaced apart from and parallel to each other, and at least one second portion, the two first portions being in contact with the emitter regions, and extending beyond the surface area of the base region, the two first portions being connected electrically to each other at their end parts by the second portion, to connect the at least two emitter regions to each other electrically; and both the emitter electrode layer and the gate electrode layers of the MOS transistors being simultaneously formed, wherein the emitter electrode layer and the gate electrode layers are each made of a stacked structure formed of a polysilicon layer and a refractory metal layer.

11. The semiconductor device according to claim 10, which includes:

a semiconductor substrate of the first conductivity type;

a semiconductor layer of the second conductivity type formed on the semiconductor substrate;

first semiconductor regions of the second conductivity type selectively formed in the semiconductor layer of the second conductivity type;

second semiconductor regions of the first conductivity type, which extend from a surface of the semiconductor layer of the second conductivity type to the first semiconductor regions;

a field insulation layer formed in the semiconductor layer, and surrounding the base region; and a base electrode layer insulatively disposed over the emitter electrode layer and being in contact with the surface area of the base region;

said emitter electrode layer extending from the base electrode layer to the field insulation layer.

12. The semiconductor device according to claim 11, wherein the base electrode layer has an impurity of the first conductivity type doped therein, and is in contact with the surface area of the base region, at least one base contact region being formed by diffusion of the impurity of the first conductivity type from the base electrode layer into the surface area of the base region.

13. The semiconductor device according to claim 11, wherein the base electrode layer is made of a refractory metal layer.

14. The semiconductor device according to claim 11, wherein the base electrode layer is made of a metal silicide layer.

15. The semiconductor device according to claim 12, wherein the base electrode layer is made of a laminated layer of a polysilicon layer under a refractory metal layer.

16. The semiconductor device according to claim 12, wherein the base electrode layer is made of a polysilicon layer.

17. The semiconductor device according to claim 12, wherein the base electrode layer is made of a polycide layer formed of a polysilicon layer with a metal silicide layer laminated thereon.

18. The semiconductor device according to claim 12, wherein the base electrode layer is made of a stacked layer formed of a polysilicon layer with a refractory metal layer laminated thereon.

19. A semiconductor device including at least one bipolar transistor and a plurality of MOS transistors of first and second type, the MOS transistors having gate electrode layers, comprising:
   a base region of a first conductivity type of the bipolar transistor, and having a surface area;
   at least two emitter regions of a second conductivity type, formed in the base region;
   an emitter electrode layer having an impurity of the second conductivity type doped therein, the at least two emitter regions being formed by diffusion of the impurity of the second conductivity type from the emitter electrode layer into the surface area of the base region and the emitter electrode layer having at least two first portions spaced apart from and parallel to each other, and at least one second portion, the two first portions being in contact with the emitter regions, and extending beyond the surface area of the base region, the two first portions being connected electrically to each other at their end parts by the second portion, to connect the at least two emitter regions to each other electrically; and
   both the emitter electrode layer and the gate electrode layers of the MOS transistors being simultaneously formed, wherein the emitter electrode layer and the gate electrode layers are each made of a laminated layer of a polysilicon layer under a refractory metal.

20. The semiconductor device according to claim 19, which includes:
   a semiconductor substrate of the first conductivity type;
   a semiconductor layer of the second conductivity type formed on the semiconductor substrate;
   first semiconductor regions of the second conductivity type selectively formed in the semiconductor layer of the second conductivity type;
   second semiconductor regions of the first conductivity type, which extend from a surface of the semiconductor layer of the second conductivity type to the first semiconductor regions;
   a field insulation layer formed in the semiconductor layer, and surrounding the base region; and
   a base electrode layer insulatively disposed over the emitter electrode layer and being in contact with the surface area of the base region;
   said emitter electrode layer extending from the base electrode layer to the field insulation layer.

21. The semiconductor device according to claim 20, wherein the base electrode layer has an impurity of the first conductivity type doped therein, and is in contact with the surface area of the base region, at least one base contact region being formed by diffusion of the impurity of the first conductivity type from the base electrode layer into the surface area of the base region.

22. The semiconductor device according to claim 20, wherein the base electrode layer is made of a refractory metal layer.

23. The semiconductor device according to claim 20, wherein the base electrode layer is made of a metal silicide layer.

24. The semiconductor device according to claim 21, wherein the base electrode layer is made of a laminated layer of a polysilicon layer under a refractory metal layer.

25. The semiconductor device according to claim 21, wherein the base electrode layer is made of a polysilicon layer.

26. The semiconductor device according to claim 21, wherein the base electrode layer is made of a polycide layer formed of a polysilicon layer with a metal silicide layer laminated thereon.

27. The semiconductor device according to claim 21, wherein the base electrode layer is made of a stacked layer formed of a polysilicon layer with a refractory metal layer laminated thereon.

28. A semiconductor device including at least one bipolar transistor and a plurality of MOS transistors of first and second type, the MOS transistors having gate electrode layers, comprising:
   a base region of a first conductivity type of the bipolar transistor, and having a surface area;
   at least two emitter regions of a second conductivity type, formed in the base region;
   an emitter electrode layer having an impurity of the second conductivity type doped therein, the at least two emitter regions being formed by diffusion of the impurity of the second conductivity type from the emitter electrode layer into the surface area of the base region and the emitter electrode layer having at least two first portions spaced apart from and parallel to each other, and at least one second portion, the two first portions being in contact with the emitter regions, and extending beyond the surface area of the base region, the two first portions being connected electrically to each other at their end parts by the second portion, to connect the at least two emitter regions to each other electrically; and
   both the emitter electrode layer and the gate electrode layers of the MOS transistors being simultaneously formed, wherein the emitter electrode layer and the gate electrode layers are each made of a metal silicide layer.

29. The semiconductor device according to claim 28, which includes:
   a semiconductor substrate of the first conductivity type;
   a semiconductor layer of the second conductivity type formed on the semiconductor substrate;
   first semiconductor regions of the second conductivity type selectively formed in the semiconductor layer of the second conductivity type;
   second semiconductor regions of the first conductivity type, which extend from a surface of the semiconductor layer of the second conductivity type to the first semiconductor regions;
   a field insulation layer formed in the semiconductor layer, and surrounding the base region; and a base electrode layer insulatively disposed over the emitter electrode layer and being in contact with the surface area of the base region;

said emitter electrode layer extending from the base electrode layer to the field insulation layer.

30. The semiconductor device according to claim 29, wherein the base electrode layer has an impurity of the first conductivity type doped therein, and is in contact with the surface area of the base region, at least one base contact region being formed by diffusion of the impurity of the first conductivity type from the base electrode layer into the surface area of the base region.

31. The semiconductor device according to claim 29, wherein the base electrode layer is made of a refractory metal layer.

32. The semiconductor device according to claim 29, wherein the base electrode layer is made of a metal silicide layer.

33. The semiconductor device according to claim 30, wherein the base electrode layer is made of a laminated layer of a polysilicon layer under a refractory metal layer.

34. The semiconductor device according to claim 30, wherein the base electrode layer is made of a polysilicon layer.

35. The semiconductor device according to claim 30, wherein the base electrode layer is made of a polycide layer formed of a polysilicon layer with a metal silicide layer laminated thereon.

36. The semiconductor device according to claim 30, wherein the base electrode layer is made of a stacked layer formed of a polysilicon layer with a refractory metal layer laminated thereon.

37. A semiconductor device including at least one bipolar transistor and a plurality of MOS transistors of first and second type, the MOS transistors having gate electrode layers, comprising:

a base region of a first conductivity type of the bipolar transistor, and having a surface area;

at least two emitter regions of a second conductivity type, formed in the base region;

an emitter electrode layer having an impurity of the second conductivity type doped therein, the at least two emitter regions being formed by diffusion of the impurity of the second conductivity type from the emitter electrode layer into the surface area of the base region and the emitter electrode layer having at least two first portions spaced apart from and parallel to each other, and at least one second portion, the two first portions being in contact with the emitter regions, and extending beyond the surface area of the base region, the two first portions being connected electrically to each other at their end parts by the second portion, to connect the at least two emitter regions to each other electrically;

both the emitter electrode layer and the gate electrode layers of the MOS transistors being simultaneously formed, wherein the emitter electrode layers and the gate electrode layers are each made of polysilicon layers;

a semiconductor substrate of the first conductivity type;

a semiconductor layer of the second conductivity type formed on the semiconductor substrate;

first semiconductor regions of the second conductivity type selectively formed in the semiconductor layer of the second conductivity type;

second semiconductor regions of the first conductivity type, which extend from a surface of the semiconductor layer of the second conductivity type to the first semiconductor regions;

a field insulation layer formed in the semiconductor layer, and surrounding the base region; and a base electrode layer insulatively disposed over the emitter electrode layer and being in contact with the surface area of the base region;

said emitter electrode layer extending from the base electrode layer to the field insulation layer.

38. The semiconductor device according to claim 37, wherein the base electrode layer has an impurity of the first conductivity type doped therein, and is in contact with the surface area of the base region, at least one base contact region being formed by diffusion of the impurity of the first conductivity type from the base electrode layer into the surface area of the base region.

39. The semiconductor device according to claim 37, wherein the base electrode layer is made of a refractory metal layer.

40. The semiconductor device according to claim 37, wherein the base electrode layer is made of a metal silicide layer.

41. The semiconductor device according to claim 38, wherein the base electrode layer is made of a laminated layer of a polysilicon layer under a refractory metal layer.

42. The semiconductor device according to claim 38, wherein the base electrode layer is made of a polysilicon layer.

43. The semiconductor device according to claim 38, wherein the base electrode layer is made of a polycide layer formed of a polysilicon layer with a metal silicide layer laminated thereon.

44. The semiconductor device according to claim 38, wherein the base electrode layer is made of a stacked layer formed of a polysilicon layer with a refractory metal layer laminated thereon.

* * * * *

UNITED STATES PATENT AND TRADEMARK OFFICE
CERTIFICATE OF CORRECTION

PATENT NO. : 5,280,188
DATED : January 18, 1994
INVENTOR(S) : Hiroshi Iwasaki

It is certified that error appears in the above-indentified patent and that said Letters Patent is hereby corrected as shown below:

Claim 3, column 17, line 45, change "1" to --2--.

Signed and Sealed this

Tenth Day of January, 1995

Attest:

BRUCE LEHMAN

Attesting Officer  Commissioner of Patents and Trademarks